(12) United States Patent
Shin et al.

(10) Patent No.: US 11,690,168 B2
(45) Date of Patent: Jun. 27, 2023

(54) DISPLAY DEVICE AND AN INSPECTION METHOD OF A DISPLAY DEVICE

(71) Applicant: SAMSUNG DISPLAY CO., LTD., Yongin-si (KR)

(72) Inventors: Yong Jin Shin, Asan-si (KR); Kyun Ho Kim, Yongin-si (KR); Uk Jae Jang, Gongju-si (KR); Bong Im Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 293 days.

(21) Appl. No.: 16/951,060

(22) Filed: Nov. 18, 2020

(65) Prior Publication Data
US 2021/0153343 A1    May 20, 2021

(30) Foreign Application Priority Data
Nov. 20, 2019    (KR) .................. 10-2019-0149956

(51) Int. Cl.
*H05K 1/02*    (2006.01)
*H05K 1/18*    (2006.01)
(Continued)

(52) U.S. Cl.
CPC .......... *H05K 1/0268* (2013.01); *G09G 3/006* (2013.01); *H01L 23/49838* (2013.01);
(Continued)

(58) Field of Classification Search
CPC .......... H05K 1/0268; H05K 1/14; H05K 1/18; H05K 2201/049; H05K 2201/10128;
(Continued)

(56) References Cited

U.S. PATENT DOCUMENTS 10,321,559 B2 *   6/2019   Meng ................. H05K 1/14
11,487,145 B2 *  11/2022   Liu .................. G02F 1/133512
(Continued)

FOREIGN PATENT DOCUMENTS

KR    10-2019-0025091    3/2019

OTHER PUBLICATIONS

Extended European Search Report dated Jul. 21, 2021 in corresponding European Patent Appln No. EP20208287.1.

*Primary Examiner* — Alvaro E Fortich
*Assistant Examiner* — Zannatul Ferdous
(74) *Attorney, Agent, or Firm* — F. Chau & Associates, LLC

(57) ABSTRACT

A display device including: a display panel; a first substrate attached to a side of the display panel; and a second substrate attached to a side of the first substrate, wherein the display panel includes a first panel test pad and a second panel test pad, the first substrate includes a 1-1 circuit test lead overlapping and connected to the first panel test pad, a 1-2 circuit test lead overlapping and connected to the second panel test pad, a 2-1 circuit test lead overlapping and connected to the second substrate, a 1-1 test lead line connected to the 1-1 circuit test lead, a 1-2 test lead line connected to the 1-2 circuit test lead, and a first test lead line connected to the 2-1 circuit test lead, and the 1-1 test lead line and the 1-2 test lead line are connected to the first test lead line.

21 Claims, 24 Drawing Sheets

(51) Int. Cl.
 *H01L 23/498* (2006.01)
 *H05K 1/14* (2006.01)
 *G09G 3/00* (2006.01)

(52) U.S. Cl.
 CPC ............... *H05K 1/14* (2013.01); *H05K 1/18* (2013.01); *G09G 2330/12* (2013.01); *H01L 23/4985* (2013.01); *H05K 2201/049* (2013.01); *H05K 2201/10128* (2013.01)

(58) Field of Classification Search
 CPC .... H05K 3/361; G09G 3/006; G09G 2330/12; G09G 2300/0408; G09G 2300/0426; H01L 23/4985; G01R 27/205; G01R 31/2808; G01R 31/2812; G01R 31/2813
 See application file for complete search history.

(56) References Cited

U.S. PATENT DOCUMENTS

| | | | |
|---|---|---|---|
| 2003/0065367 A1* | 4/2003 | Youker | H01L 23/4985 607/36 |
| 2007/0145566 A1 | 6/2007 | Youker et al. | |
| 2007/0296090 A1 | 12/2007 | Hembree | |
| 2008/0293168 A1 | 11/2008 | Youker et al. | |
| 2009/0206340 A1* | 8/2009 | Lee | H01L 27/124 257/59 |
| 2013/0257841 A1 | 10/2013 | Shim et al. | |
| 2017/0265297 A1 | 9/2017 | Onishi | |
| 2019/0064239 A1 | 2/2019 | Lee et al. | |
| 2019/0348357 A1* | 11/2019 | Lee | H01L 23/4985 |
| 2020/0267837 A1* | 8/2020 | Cheong | H01R 12/52 |

\* cited by examiner

TP_PAD: TP_PAD1, TP_PAD2, TP_PAD3, TP_PAD4
TM_PAD: TM_PAD1, TM_PAD2, TM_PAD3, TM_PAD4

TP_PAD: TP_PAD1, TP_PAD2, TP_PAD3, TP_PAD4

TP_PAD: TP_PAD1, TP_PAD2, TP_PAD3, TP_PAD4

DISPLAY DEVICE AND AN INSPECTION METHOD OF A DISPLAY DEVICE

This application claims priority under 35 U.S.C. 119 to Korean Patent Application No. 10-2019-0149956 filed on Nov. 20, 2019 in the Korean Intellectual Property Office, the disclosure of which is incorporated by reference herein in its entirety.

TECHNICAL FIELD

The present invention relates to a display device and an inspection method thereof.

DESCRIPTION OF THE RELATED ART

Display devices are devices configured to present information in visual form. Such display devices include a substrate partitioned into a display area and a non display area. In the display area, a plurality of pixels are disposed on the substrate, and in the non-display area, a plurality of pads, peripheral circuits and the like are disposed on the substrate. A flexible film (e.g., a chip on film (COF)) on which a driving circuit or the like is mounted may be coupled to the plurality of pads to transmit driving signals to the pixels.

The flexible film may include a plurality of leads coupled to the plurality of pads, and each of the leads may be bonded to a separate pad.

A contact resistance between the pad and the lead may be measured by measuring a contact resistance between an inspection pad located on the same layer as the pads and an inspection lead located on the same layer as the leads. In other words, the contact resistance between an inspection pad and an inspection lead may correspond to the contact resistance between a pad and a lead.

SUMMARY

According to an exemplary embodiment of the present invention, a display device may it a display panel; a first substrate attached to a side of the display panel; and a second substrate attached to a side of the first substrate, wherein the display panel includes a first panel test pad and a second panel test pad, the first substrate includes a 1-1 circuit test lead overlapping and connected to the first panel test pad, a 1-2 circuit test lead overlapping and connected to the second panel test pad, a 2-1 circuit test lead overlapping and connected to the second substrate, a 1-1 test lead line connected to the 1-1 circuit test lead, a 1-2 test lead line connected to the 1-2 circuit test lead, and a first test lead line connected to the 2-1 circuit test lead, and the 1-1 test lead line and the 1-2 test lead line are connected to the first test lead line.

The second substrate may include a first main test pad overlapping and connected to the 2-1 circuit test lead, and a first test point connected to the first main test pad.

The first panel test pad and the second panel test pad may be electrically connected to each other through a first panel test line connected to the first panel test pad, a second panel test line connected to the second panel test pad, and a panel common test line connecting the first panel test line and the second panel test line.

The display panel may further include a third panel test pad and a third panel test line connected to the third panel test pad; and the third panel test line may be connected to the panel common test line.

The first substrate may further include a 1-3 circuit test lead overlapping and connected to the third panel test pad, and a 2-2 circuit test lead overlapping and connected to the second substrate; and the 1-3 circuit test lead may be connected to the 2-2 circuit test lead.

The second substrate may further include a second main test pad overlapping and connected to the 2-2 circuit test lead, and a second test point connected to the second main test pad.

The display panel may further include a fourth panel test pad and a fourth panel test line connected to the fourth panel test pad; and the fourth panel test line may be connected to the panel common test line.

The first substrate may further include a 1-4 circuit test lead overlapping and connected to the fourth panel test pad, and a 2-3 circuit test lead and a 2-4 circuit test lead overlapping and connected to the second substrate; and the 2-3 circuit test lead and the 2-4 circuit test lead may be connected to the 1-4 circuit test lead.

The second substrate may further include a third main test pad overlapping and connected to the 2-3 circuit test lead, and a fourth main test pad overlapping and connected to the 2-4 circuit test lead; and the third main test pad and the fourth main test pad may be connected to a third test point.

The first substrate may further include a first test lead line, a 1-1 test lead line, and a 1-2 test lead line; the first test lead line may be physically connected to the 2-1 circuit test lead; the 1-1 test lead line may be physically connected to the 1-1 circuit test lead; the 1-2 test lead line may be physically connected to the 1-2 circuit test lead; and the 1-1 test lead line and the 1-2 test lead line may be physically connected to the first test lead line.

The first substrate may further include a second test lead line configured to electrically connect the 1-3 circuit test lead and the 2-2 circuit test lead.

The first substrate may further include a third test lead line connected to the 1-4 circuit test lead, a 3-1 lead test line connected to the 2-3 circuit test lead, and a 3-2 lead test line connected to the 2-4 circuit test lead; and the 3-1 lead test line and the 3-2 lead test line may be connected to the third test lead line.

The first substrate further includes a data driving integrated circuit; and all of the panel test pads, the circuit test leads, and the main test pads are insulated from the data driving integrated circuit.

The 1-1 test lead line may be physically connected to the 1-1 circuit test lead; the 1-2 test lead line may be physically connected to the 1-2 circuit test lead; the first test lead line may be physically connected to the 2-1 circuit test lead; and the 1-1 test lead line and the 1-2 test lead line may be physically connected to the first test lead line.

According to an exemplary embodiment of the present invention, a display device may include: a display panel including a data driving integrated circuit; and a first substrate attached to a side of the display panel, wherein the display panel includes a first panel test pad and a second panel test pad, the first substrate includes a 1-1 circuit test lead overlapping and connected to the first panel test pad, a 1-2 circuit test lead overlapping and connected to the second panel test pad, and a first test point connected to the 1-1 circuit test lead and the 1-2 circuit test lead.

The display panel may further include a third panel test pad; and the first substrate may further include a 1-3 circuit test lead overlapping and connected to the third panel test pad, and a second test point connected to the 1-3 circuit test lead.

The display panel may further include a fourth panel test pad; and the first substrate may further include a 1-4 circuit test lead overlapping and connected to the fourth panel test pad, and a third test point connected to the 1-4 circuit test lead.

The first substrate may further include a first test lead line, a 1-1 test lead line, and a 1-2 test lead line; the first test lead line may be connected to the first test point; the 1-1 test lead line may be physically connected to the 1-1 circuit test lead; the 1-2 test lead line may be physically connected to the 1-2 circuit test lead; and the 1-1 test lead line and the 1-2 test lead line may be physically connected to the first test lead line.

According to an exemplary embodiment of the present invention, an inspection method of a display device includes: providing a display device including a display panel including a first panel test pad, a second panel test pad, a third panel test pad and a fourth panel test pad, a first substrate including a 1-1 circuit test lead, a 1-2 circuit test lead, a 1-3 circuit test lead, a 1-4 circuit test lead, a 2-1 circuit test lead, a 2-2 circuit test lead, a 2-3 circuit teat lead and a 2-4 circuit test lead, wherein the 1-1 circuit test lead to the 1-4 circuit test lead are respectively connected to the first panel test pad to the fourth panel test pad, and a second substrate including a first main test pad, a second main test pad, a third main test pad and a fourth main test pad respectively connected to the 2-1 circuit test lead to the 2-4 circuit test lead, a first test point connected to the first main test pad, a second test point connected to the second main test pad, and a third test point connected to the third main test pad and the fourth main test pad, wherein the 1-1 circuit test lead and the 1-2 circuit test lead are connected to the 2-1 circuit test lead in parallel, the 1-3 circuit test lead is connected to the 2-2 circuit test lead, and the 2-3 circuit test lead and the 2-4 circuit test lead are electrically connected to the 1-4 circuit test lead; bringing jigs into contact with the first point and the second test point to obtain a first measured value; bringing the jigs into contact with the second test point and the third test point to obtain a second measured value; bringing the jigs into contact with the first test point and the third test point to obtain a third measured value; and determining a contact resistance between the first panel test pad and the 1-1 circuit test lead, a contact resistance between the second panel test pad and the 1-2 circuit test lead, a contact resistance between the third panel test pad and the 1-3 circuit test lead and a contact resistance between the fourth panel test pad and the 1-4 circuit test lead using the first measured value, the second measure value and the third measured value.

In obtaining the first measured value, resistances of the jigs which come into contact with the first test point and the second test point are considered; in obtaining the second measured value, resistances of the jigs which come into contact with the second test point and the third test point are considered; and in obtaining the third measured value, resistances of the jigs which come into contact with the first test point and the third test point are considered.

A resistance value of the display panel may be removed from the step of determining the contact resistance between the first panel test pad and the 1-1 circuit test lead, the contact resistance between the second panel test pad and the 1-2 circuit test lead, the contact resistance between the third panel test pad and the 1-3 circuit test lead and the contact resistance between the fourth panel test pad and the 1-4 circuit test lead.

BRIEF DESCRIPTION OF THE DRAWINGS

The above and other features of the present invention will become more apparent by describing; in detail exemplary embodiments thereof with reference to the attached drawings, in which.

DETAILED DESCRIPTION OF THE EMBODIMENTS

Figure 1:
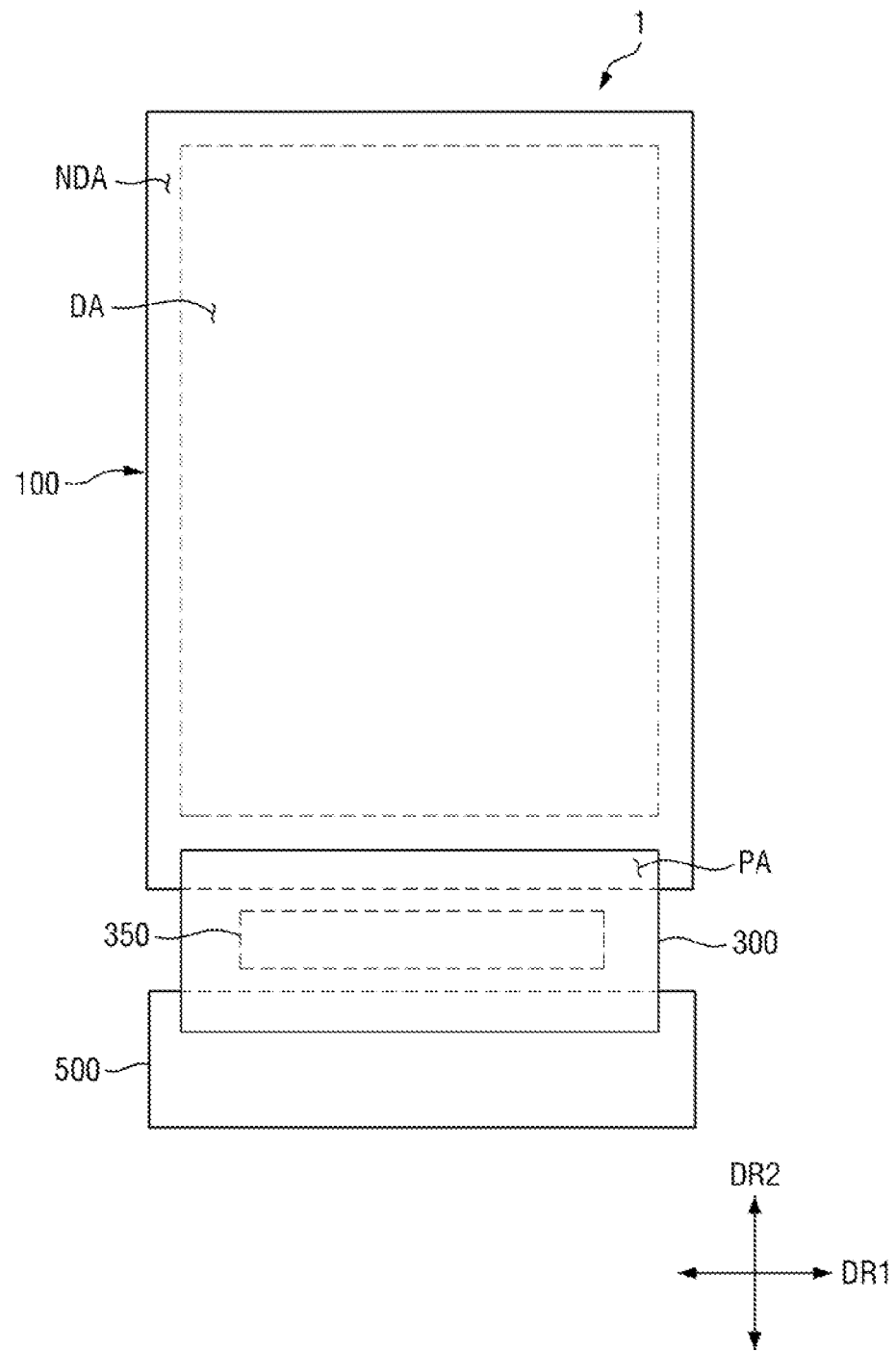
FIG. 1 is a planar layout view of a display device according to an exemplary embodiment of the present invention.

Specific structural and functional descriptions of exemplary embodiments of the present invention disclosed herein are for illustrative purposes. The present invention may be embodied in ma different forms, and thus, the present invention is not limited to the embodiments disclosed herein.

It will be understood that when an element is referred to as being related to another element such as being "coupled" or "connected" to another element, it can be directly coupled or connected to the other element or intervening elements may be present therebetween. Other expressions that explain the relationship between elements, such as "between," "directly between," "adjacent to," or "directly adjacent to," may be construed in a similar fashion.

Throughout the specification, the same reference numerals may refer to the same or like parts.

As used herein, "a", "an" "the," and "at least one" are intended to include both the singular and plural, armless the context clearly indicates otherwise.

Hereinafter, exemplary embodiments of the present invention will be described with reference to the attached drawings.

FIG. 1 is a planar layout view of a display device according to an exemplary embodiment of the present invention.

A display device 1 is a device configured to display a video or a still image and may be used as a display screen of portable electronic devices such as a mobile phone, a smart phone, a tablet personal computer (PC), a smart watch, a watch phone, a mobile communication terminal, an electronic notebook, an electronic book, a portable multimedia player (PMP), a navigation device, an ultra-mobile personal computer (UMPC), and the like. The display device 1 may also be used as a display screen of various other products such as a television, a notebook, a monitor, a billboard, an Internet of Things device, or the like.

Referring to FIG. 1, the display device 1 may include a display panel 100 configured to display an image, a first substrate 300 connected to the display panel 100, and a second substrate 500 connected to the first substrate 300.

As the display panel 100, for example, an organic light emitting display panel may be applied. In the following exemplary embodiments of the present invention, although an example in which the organic light emitting display panel is applied as the display panel 100 is described, the present invention is not limited thereto. For example, various display panels such as a liquid crystal display (LCD) panel, a quantum dot organic light emitting display (QD-OLED) panel, a quantum dot liquid crystal display (QD-LCD) panel, a quantum nano light emitting display panel (QNED), a micro LED panel, and the like may be applied.

The display panel 100 includes a display area DA including a plurality of pixel areas and a non-display area NDA disposed around the display area DA. The display area DA may have a rectangular shape in which corners each have a right angle in a plan view or a rectangular shape in which corners each are round in a plan view. The display area DA may have short sides and long sides. The short sides of the display area DA may be sides of the display area DA which extend in a first direction DR1. The long sides of the display area DA may be sides of the display area DA which extend in a second direction DR2. However, a planar shape of the display area DA is not limited to the rectangular shape, and the display area DA may have various other shapes such as a circular shape, an elliptical shape, or the like. The non-display area NDA may be disposed adjacent to both short sides and both long sides of the display area DA In this case, the non-display area NDA may surround all sides of the display area DA and configure an edge of the display area DA. However, the present invention is not limited thereto and the non-display area NDA may be disposed adjacent to only both short sides or only both long sides of the display area DA. In addition, the non-display area NDA may be adjacent to just one short side and one long side of the display area DA.

The non-display area NDA of the display panel 100 further includes a panel pad area PA. The panel pad area PA may be, for example, disposed around one short side of the display area DA, but is not limited thereto. For example, the panel pad area PA may be disposed around both short sides of the display area DA or around both short sides and both long sides of the display area DA.

The first substrate 300 may include a printed base film (310 in FIG. 6) and a driving integrated circuit 350 disposed on the printed base film 310. The printed base film 310 may include an insulative flexible material. In some exemplary embodiments of the present invention, the first substrate 300 may be a flexible substrate.

The first substrate 300 may include a first circuit area of which one side is attached to the panel pad area PA of the display panel 100, a second circuit area disposed at one side of the first circuit area in the second direction DR2, and a third circuit area disposed at one side of the second circuit area in the second direction DR2 and to which the second substrate 500 is attached. In other words, the first, second and third circuit areas may be sequentially arranged between the panel pad area PA and the second substrate 500. The driving integrated circuit 350 may be disposed on one surface of the second circuit area of the first substrate 300. The driving integrated circuit 350 may be, for example, a data driving integrated circuit, and a chip-on-film (COF) method implemented as a data driving chip may be applied.

The second substrate 500 may include a circuit pad area attached to the third circuit area of the first substrate 300. A plurality of circuit pads are disposed in the circuit pad area of the second substrate 500 to be connected to lead lines disposed in the third circuit area of the first substrate 300. The second substrate 500 may include a printed circuit board. The printed circuit board may be a flexible substrate including a flexible material, but is not limited thereto, and may be a rigid substrate including a rigid material.

The first substrate 300 may be bent in a thickness direction (e.g., in the case of a top emission display device, a backward direction). The other side of the first substrate 300 and the second substrate 500 may be located on a lower portion of the display panel 100.

Figure 2:
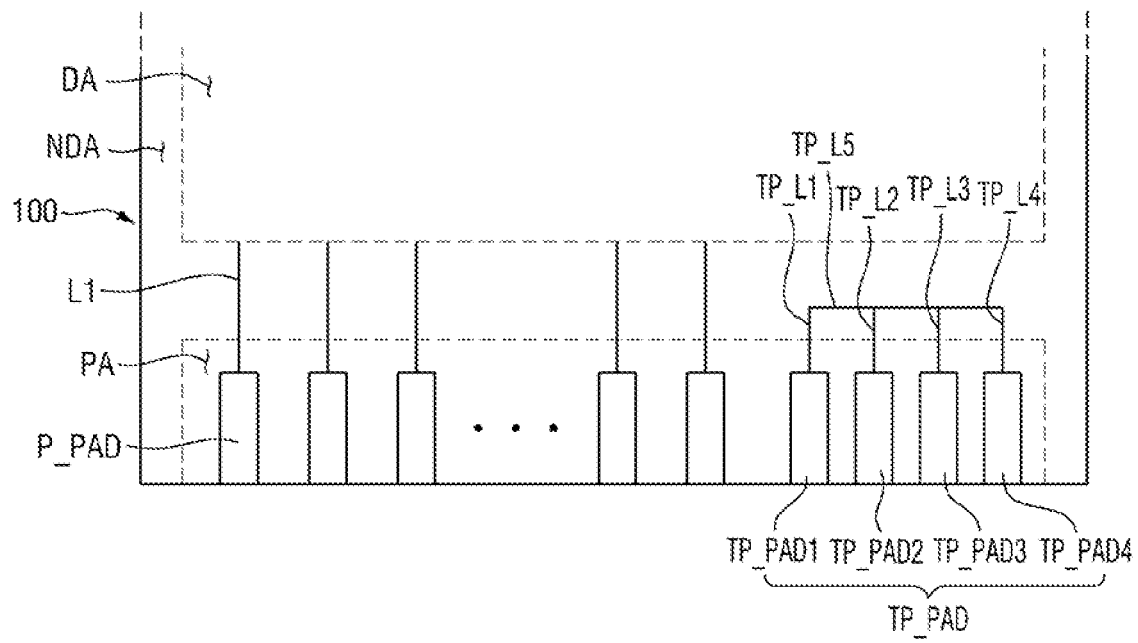
FIG. 2 is a planar layout view of a display panel in FIG. 1.
Figure 3:
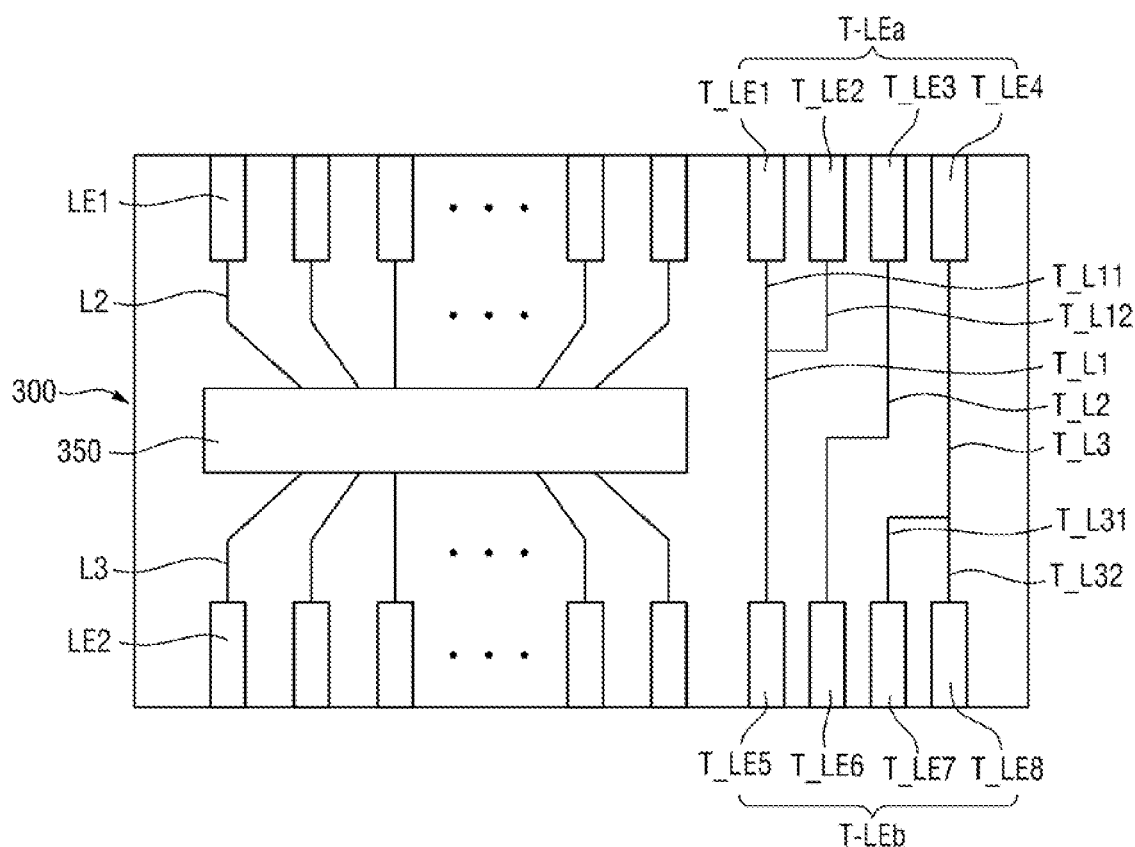
FIG. 3 is a planar layout view of a first substrate in FIG. 1.
Figure 4:
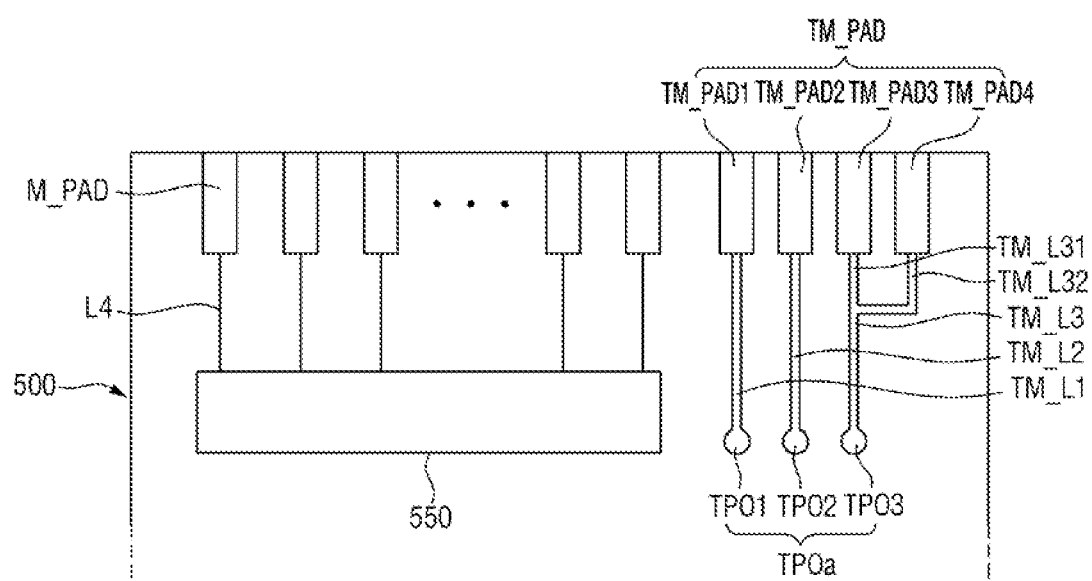
FIG. 4 is a planar layout view of a second substrate in FIG. 1.
Figure 5:
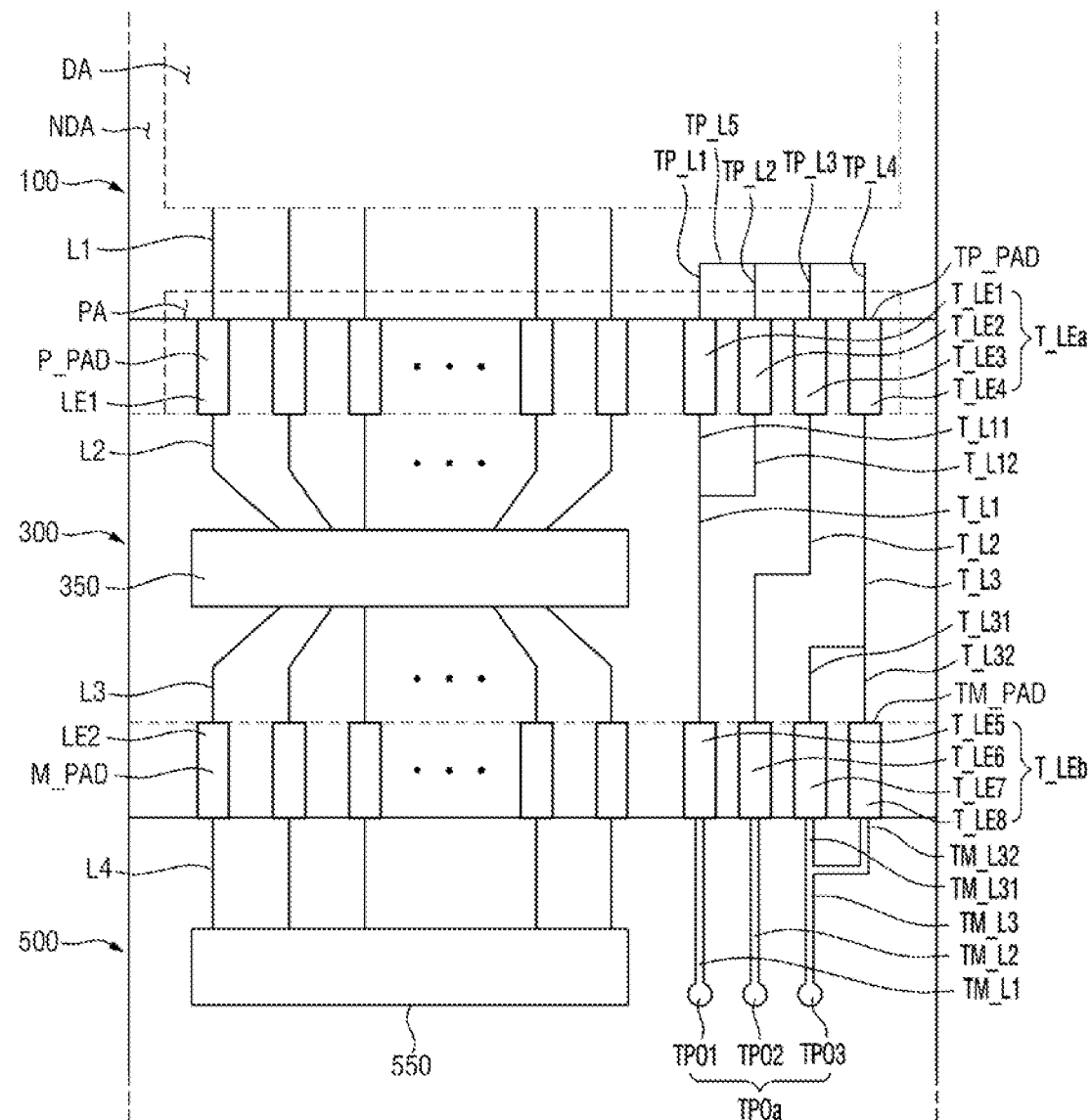
FIG. 5 is a planar layout view of a panel pad area, a first substrate, and a second substrate in FIG. 1.
Figure 6:
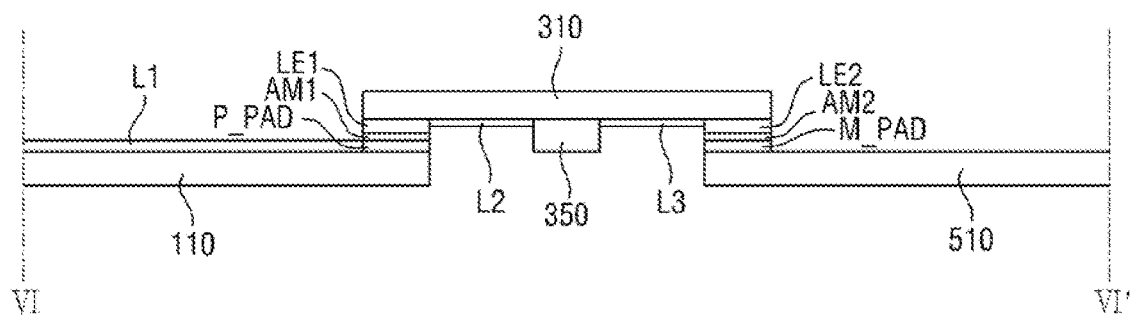
FIG. 6 is a cross-sectional view or a panel pad, a first lead line, a second lead line, and a circuit pad in FIG. 5.
Figure 7:
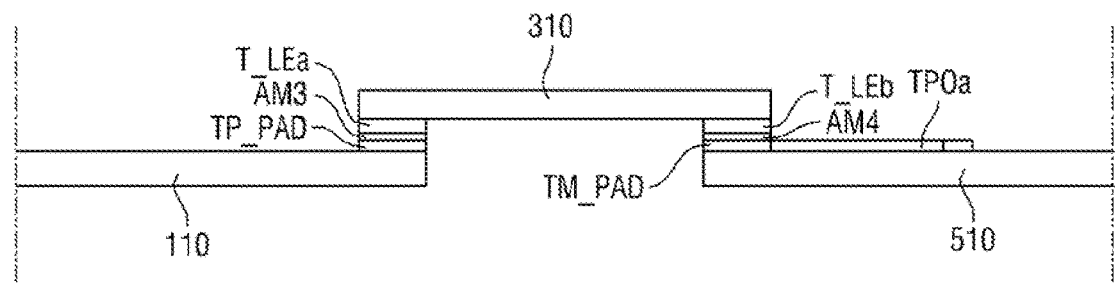
FIG. 7 is a cross-sectional view of an inspection panel pad, a first inspection lead line, a second inspection lead line, and an inspection circuit pad in FIG. 5.

FIG. 2 is a planar layout view of the display panel in FIG. 1, FIG. 3 is a planar layout view of the first substrate in FIG. 1, FIG. 4 is a planar layout view of the second substrate in FIG. 1, FIG. 5 is a planar layout view of the panel pad area, the first substrate, and the second substrate in FIG. 1, FIG. 6 is a cross-sectional view of a panel pad, a first lead line, a second lead line, and a circuit pad in FIG. 5, and FIG. 7 is a cross-sectional view of an inspection panel pad, a first inspection lead line, a second inspection lead line, and an inspection circuit pad in FIG. 5.

Referring to FIG. 2, a panel pad P_PAD and panel test pads (TP_PADs: TP_PAD1, TP_PAD2, TP_PAD3 and TP_PAD4) may be disposed in a panel pad area PA. The panel pad P_PAD may be plural in number, and the plurality of panel pads P_PAD may be arranged along the first direction DR1. The plurality of panel pads P_PAD may, for example, include a power pad, a data pad, and a panel dummy pad. The first direction DR1 may be a direction from a first end portion of the panel pad area PA toward a second end portion of the panel pad area PA opposite the first end portion. The second direction DR2 refers to a direction crossing the first direction DR1.

The panel pads P_PAD may be electrically connected to the pixels. The panel pads P_PAD may be physically connected to the pixels of the display area DA through first signal lines L1. The first signal lines L1 may be located on a different layer from the panel pads P_PAD, but are not limited thereto. For example, the first signal lines L1 may be located on the same layer as the panel pads P_PAD.

The panel test pads TP_PAD1 to TP_PAD4 may be plural in number, and the plurality of panel test pads TP_PAD1 to TP_PAD4 may be arranged along the first direction DR1.

The panel test pads TP_PAD1 to TP_PAD4 are not electrically connected to the first signal lines L1 unlike the panel pads P_PAD, and may not be physically connected to the first signal lines L1.

The display panel 100 may include a first panel test line TP_L1 electrically connected to the first panel test pad TP_PAD1, a second panel test line TP_L2 electrically connected to the second panel test pad TP_PAD2, a third panel test line TP_L3 electrically connected to the third panel test pad TP_PAD3, and a fourth panel test line TP_L4 electrically connected to the fourth panel test pad TP_PAD4.

The first panel test line TP_L1 may be physically connected to the first panel test pad TP_PAD1, the second panel test line TP_L2 may be physically connected to the second panel test pad TP_PAD2, the third panel test line TP_L3 may be physically connected to the third panel test pad TP_PAD3, a the fourth panel test line TP_L4 may be physically connected to the fourth panel test pad TP_PAD4.

The panel test lines TP_L1 to TP_L4 may be electrically connected to each other. As shown in FIG. 2, the display panel 100 may include a panel common test line TP_L5 physically connected to the panel test lines TP_L1 to TP_L4. The panel common test line TP_L5 may be electrically connected to the panel test pads TP_PAD1 to TP_PAD4 through the panel test lines TP_L1 to TP_L4. The panel common test line TP_L5 may be physically connected to the panel test lines TP_L1 to TP_L4, and thus may be connected to the panel test pads TP_PAD1 to TP_PAD4. The panel test lines TP_L1 to TP_L4 may, for example, extend along the second direction DR2, and the panel common test line TP_L5 may extend along the first direction DR1, but the directions are not limited thereto. For example, the panel test lines TP_L1 to TP_L4 may extend from their respective panel test pads along the second direction DR2 to meet and connect with the panel common test line TP_L5.

The panel test pads TP_PAD1 to TP_PAD4 may be dummy electrodes electrically isolated from the pixels of the display area DA.

Referring to FIG. 3, a first lead line LE1 and first test leads T_LEa ma be disposed in the first circuit area of the first substrate 300, the driving integrated circuit 350 may be disposed in the second circuit area, and a second lead line LE2 and second test leads T_LEb may be disposed in the third circuit area.

The first lead line LE1 ma be electrically connected to the driving integrated circuit 350 through a second signal line L2, and the second lead line LE2 may be electrically connected to the driving integrated circuit 350 through a third signal line L3.

The first test leads T_LEa may be connected to the second test leads T_LEb, but may be electrically insulated from the driving integrated circuit 350. The first test leads T_LEa and the second test leads T_LEb may be dummy electrodes electrically and physically insulated from the driving integrated circuit 350. In other words, the first test leads T_LEa and the second test leads T_LEb are not connected to the driving integrated circuit 350.

The first test leads T_LEa may include a 1-1 test lead T_LE1, a 1-2 test lead T_LED2, a 1-3 test lead T_LE3 and a 1-4 test lead T_LE4, and the second test leads T_LEb may include a 2-1 test lead T_LE5, a 2-2 test lead T_LE6, a 2-3 test lead T_LE7 and a 2-4 test lead T_LE8.

The first substrate 300 may include a first test lead line T_L1 physically connected to the 2-1 test lead T_LE5, a 1-1 test lead line T_L11 physically connected to the 1-1 test lead T_LE1, and a 1-2 test lead line T_L12 physically connected to the 1-2 test lead T_LE2. The 1-1 test lead line T_L11 and the 1-2 test lead line T_L12 may extend along the second direction DR2 and then be connected to the first test lead line T_L1. In other words, the 1-1 test lead line T_L11 and the 1-2 test lead line T_L12 may be connected in parallel.

The first substrate 300 may include a second test lead line T_L2 configured to physically connect the 2-2 test lead T_LE6 and the 1-3 test lead T_LE3. The second test lead line T_L2 may electrically connect the 2-2 test lead T_LE6 and the 1-3 test lead T_LE3.

The first substrate 300 may include a third test lead line T_L3 physically connected to the 1-4 test lead T_LE4, a 3-1 test lead line T_L31 physically connected to the 2-3 test lead T_LE7, and a 3-2 test lead line T_L32 physically connected to the 2-4 test lead T_LE8S. The 3-1 test lead line T_L31 and the 3-2 test lead line T_L32 may be physically connected to the third test lead line T_L3. The 3-1 test lead line T_L31 and the 3-2 test lead line T_L32 may be connected in parallel.

Referring to FIG. 4, the second substrate 500 may include a main circuit pad M_PAD and a main test pad TM_PAD. The main circuit pad M_PAD may be plural in number, and the plurality of main circuit pads M_PAD may be arranged along the first direction DR1. The main circuit pads M_PAD may be electrically connected to a main circuit part 550. As the main circuit pads M_PAD may be physically connected to a fourth signal line L4, and the main circuit past 550 may be physically connected to the fourth signal line L4, the main circuit part 550 and the main circuit pads M_PAD may be electrically connected to each other through the fourth signal line L4.

The main test pad TM_PAD may be electrically insulated from the main circuit part 550 unlike the main circuit pads M_PAD. In other words, the main test pad TM_PAD may be a dummy electrode and not connected to the main circuit part 550.

The main test pad TM_PAD may be plural in number. The plurality of main test pads TM_PAD may include a first main test pad TM_PAD1, a second main test pad TM_PAD2, a third main test pad TM_PAD3 and a fourth main test pad TM_PAD4.

The second substrate 500 may include a first main test line TM_L1 physically connected to the first main test pad TM_PAD1, a second main test line TM_L2 physically connected to the second main test pad TM_PAD2, a 3-1 main test line TM_L31 physically connected to the third main test pad TM_PAD3, and a 3-2 main test line TM_L32 physically connected to the fourth main test pad TM_PAD4. Further, the second substrate 500 may include a third main test line TM_L3 physically connected to the 3-1 main test line TM_L31 and the 3-2 main test line TM_L32.

The second substrate 500 may include a first test point TPO1 physically connected to the first main test line TM_L1, a second test point TPO2 physically connected to the second main test line TM_L2, and a third test point TPO3 physically connected to the third main test line TM_L3, the 3-1 main test line TM_L31 and the 3-2 main test line TM_L32. Test points TPOa may include the first to third test points TPO1 to TPO3.

Referring to FIG. 5, the first circuit area of the first substrate 300 may be attached to the panel pad area PA, and the main circuit pads M_PAD and the main test pads TM_PAD of the second substrate 500 may be attached to the second circuit area.

For example, the first test leads T_LEa may be overlappingly disposed on the panel test pads TP_PAD1 to TP_PAD4 to be connected to the panel test pads TP_PAD1 to TP_PAD4. In addition, the first lead lines LE1 may be overlappingly disposed on the panel pads P_PAD to be connected to the panel pads P_PAD.

The second substrate 500 may be overlappingly disposed on the second test leads T_LEb to be connected to the second test leads T_LEb. The main test pads TM_PAD may be overlappingly disposed on the second test leads T_LEb to be connected to the second test leads T_LEb and the main circuit pads M_PAD may be overlappingly disposed on the second lead lines LE2 to be connected to the second lead lines LE2.

As shown in FIG. 6, the first signal lines L1 may be connected to the panel pads P_PAD, and the panel pads P_PAD and the first lead lines LE1 may be electrically connected to each other through a first coupling member AM1. The first coupling member AM1 may include an anisotropic conductive film. In exemplary embodiments of the present invention, the first coupling member AM1 may be omitted and the first lead lines LE1 and the panel pads P_PAD may be ultrasonically bonded.

The first lead lines LE1 may be electrically connected to the driving integrated circuit 350 through the second signal lines L2, and the driving integrated circuit 350 may be electrically connected to the second lead lines LE2 through the third signal lines L3. The second lead lines LE2 may be connected to the main circuit pads M_PAD through a second coupling member AM2. The second coupling member AM2 may include an anisotropic conductive film. In some exemplary embodiments of the present invention, the second coupling member AM2 may be omitted and the second lead lines LE2 and the main circuit pads M_PAD may be ultrasonically bonded.

Referring to FIG. 7, the panel test pads TP_PAD and the first test leads T_LEa may be electrically connected through a third coupling member AM3. The third coupling member AM3 may be the same configuration as the first coupling member AM1.

The main test pads TM_PAD and the second test leads T_LEb may be electrically connected through a fourth coupling member AM4. The fourth coupling member AM4 may be the same configuration as the second coupling member AM2. The main test pads TM_PAD may be respectively connected to the test points TPO1 to TPO3.

In the above-described embodiment, although an example in which the leads and lines disposed on the printed base film 310 of the first substrate 300 are disposed on one layer (e.g., the same layer) is described, in some exemplary embodiments of the present invention, the first substrate 300 may include conductive layers laminated on the printed base film 310. Insulation layers may be further disposed between the conductive layers.

For example, the 1-1 test lead line T_L11 connected to the 1-1 circuit test lead. T_LE1 and the 1-2 test lead line T_L12 connected to the 1-2 circuit test lead T_LE2 are disposed on a first layer, and the first test lead line T_L1 connected to the 2-1 circuit test lead T_LE5 may be disposed on a second layer different from the first layer. In this case, the 1-1 test lead line T_L11 and the 1-2 test lead line T_L12 may be electrically connected to the first test T_L1 through contact holes passing through the insulation layer.

The 3-1 test lead line T_L31, the 3-2 test lead line T_L32, and the third test lead line T_L3 in addition to the 1-1 test lead line T_L11, the 1-2 test lead line T_L12, and the first test lead line T_L1 which are described above may be disposed on the first layer or the second layer which are described above, and connections between them may be electric connections through contact holes.

In the present embodiment, although an example in which the first substrate 300 has two conductive layers is described, the present invention is not limited thereto, and the first substrate 300 may have three or more conductive layers.

Figure 8:
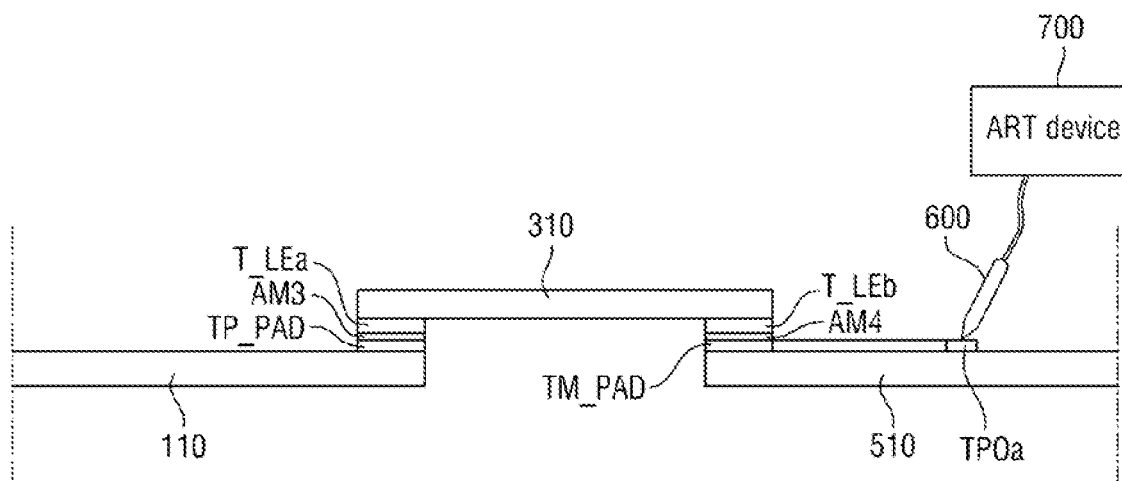
FIG. 8 is a cross-sectional view illustrating a case in which a voltage applied from a resistance measuring device is applied to an inspection point through a jig, according to an exemplary embodiment of the present invention.

FIG. 8 is a cross-sectional view illustrating a case in which a voltage applied from a resistance measuring device is applied to an inspection point through a jig, according to an exemplary embodiment of the present invention.

Referring to FIG. 8, a resistance measuring device 700 (ART device) and a jig 600 connected to the resistance measuring device 700 may be included. The resistance measuring device 700 may provide a predetermined input voltage to the test points (TPOa: TPO1 to TPO3) through the jig 600.

The resistance measuring device 700 may provide the input voltage to one of the test points (TPOa: TPO1 to TPO3) through the jig 600, and may measure an output voltage from another one of the test points (TPOa: TPO1 to TPO3) through the jig 600. Detailed descriptions will be described with reference to FIGS. 9 to 12.

Figure 9:
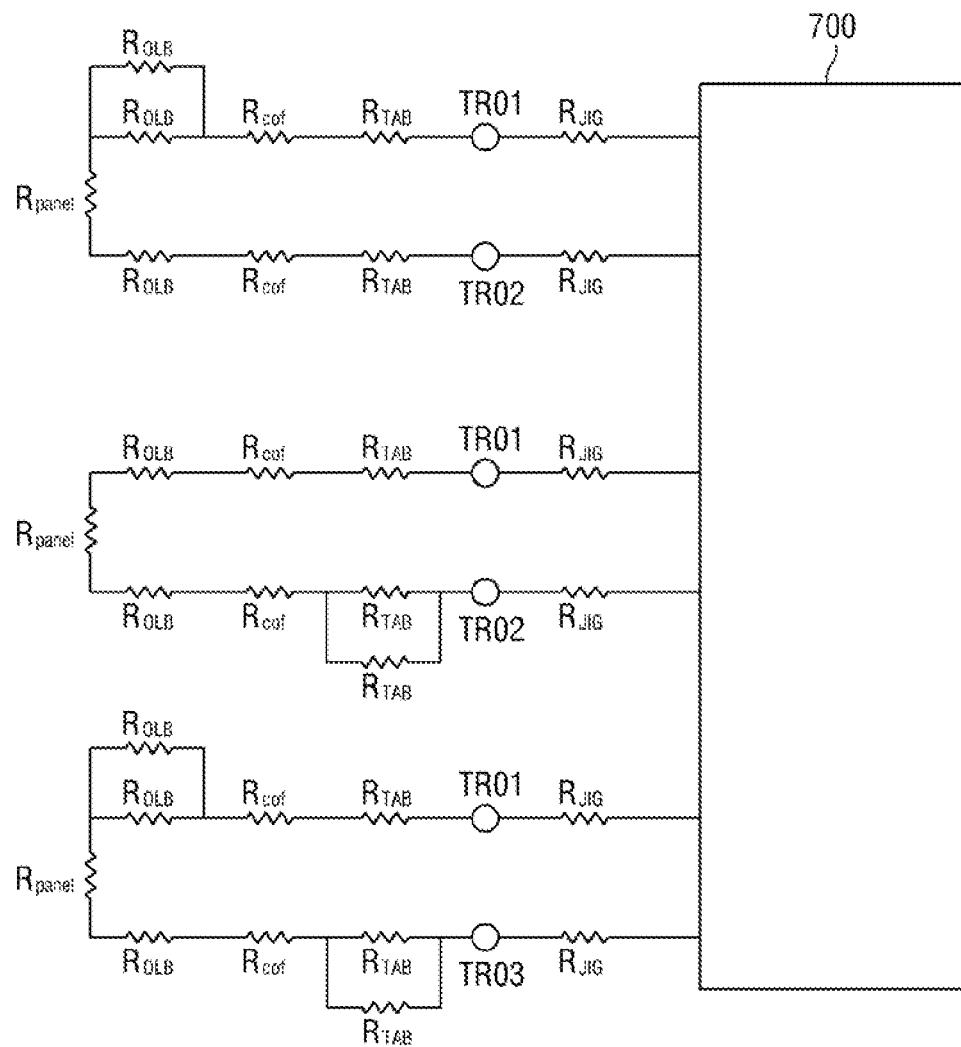
FIG. 9 is a cross-sectional view illustrating a case in which a first measured value to a third measured value are obtained through the resistance measuring device, according to a exemplary embodiment of the present invention.
Figure 10:
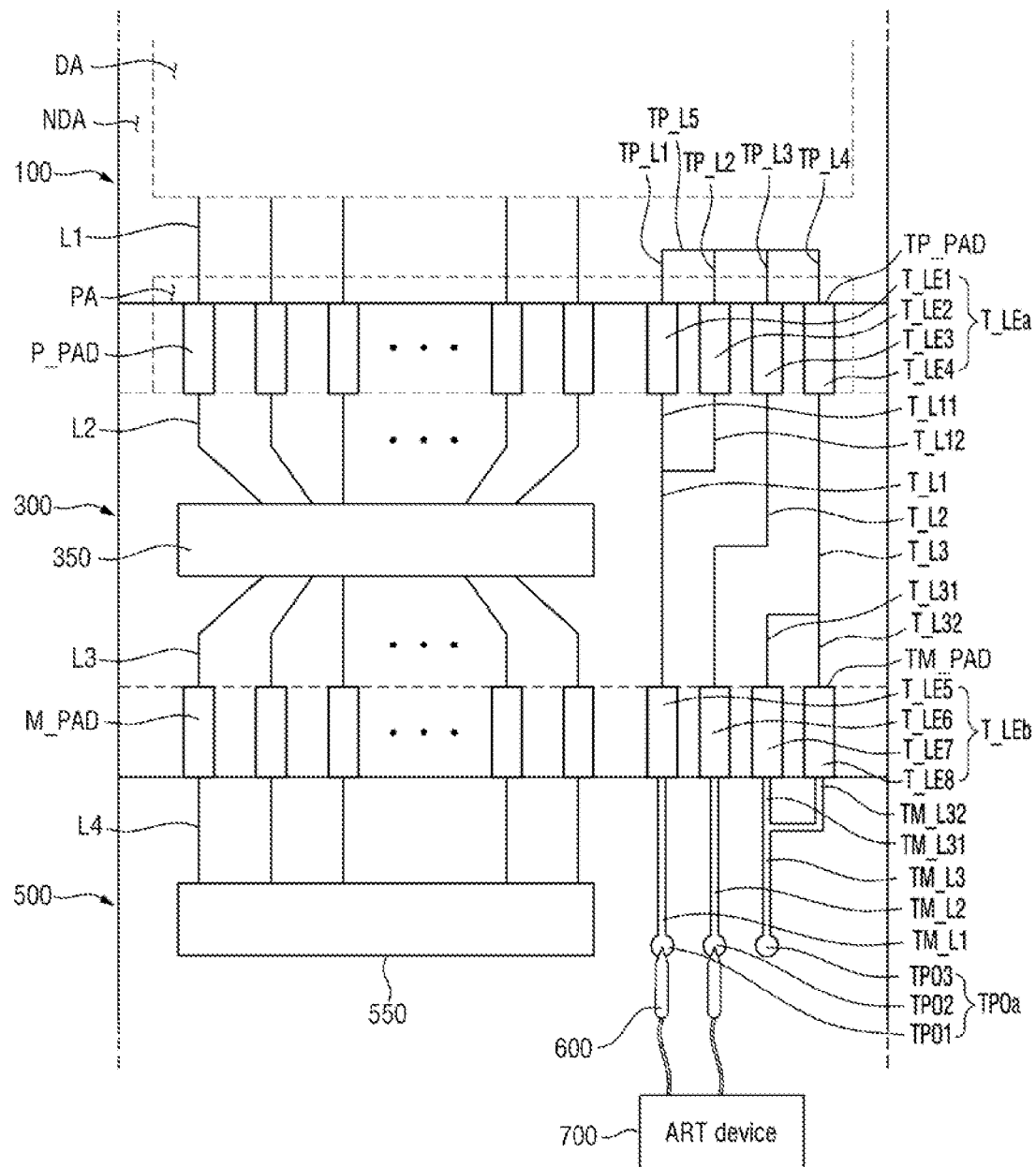
FIG. 10 is a planar layout view illustrating a case in which the first measured value is obtained.
Figure 11:
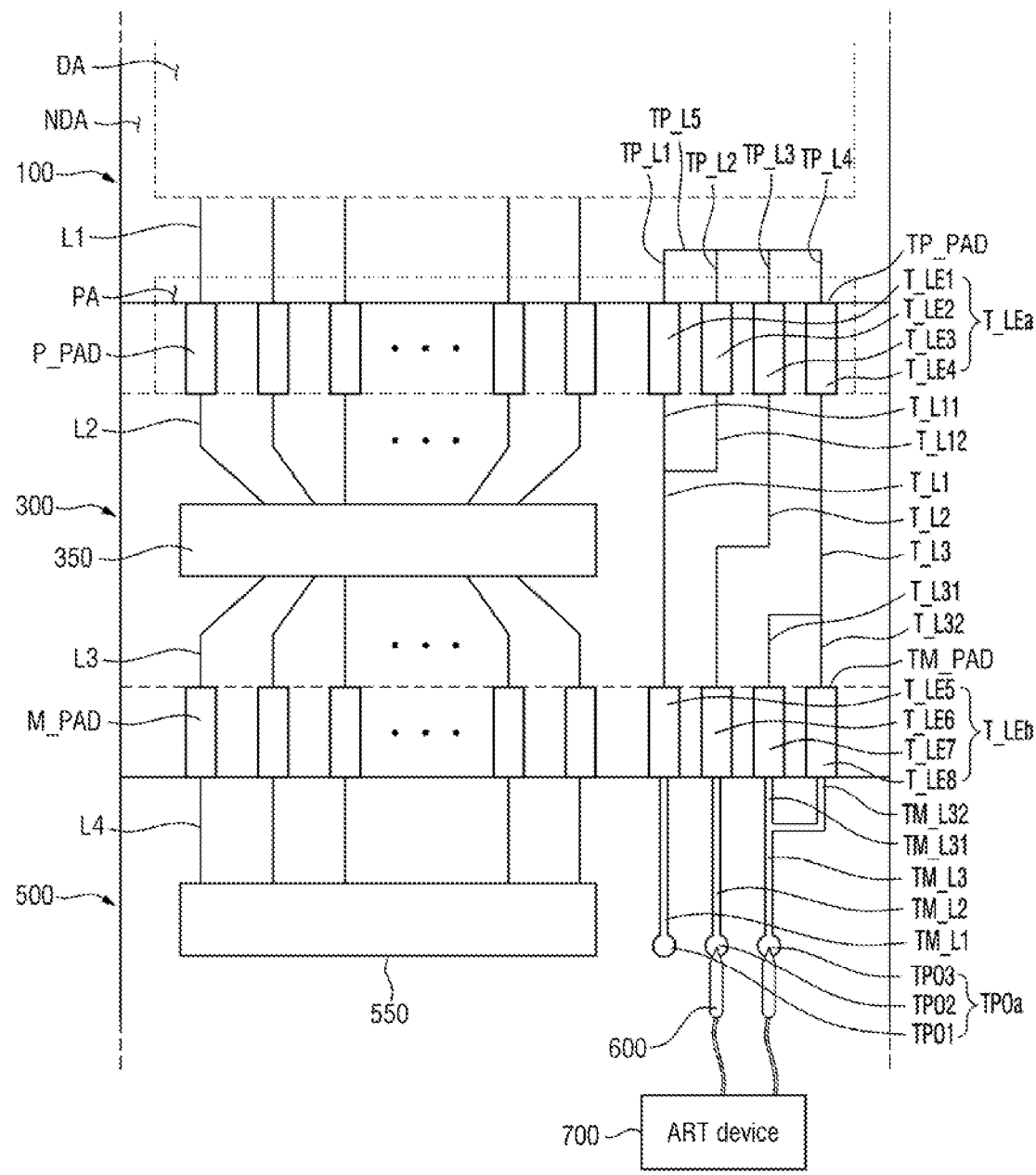
FIG. 11 is a planar layout view illustrating a case in which the second measured value is obtained.
Figure 12:
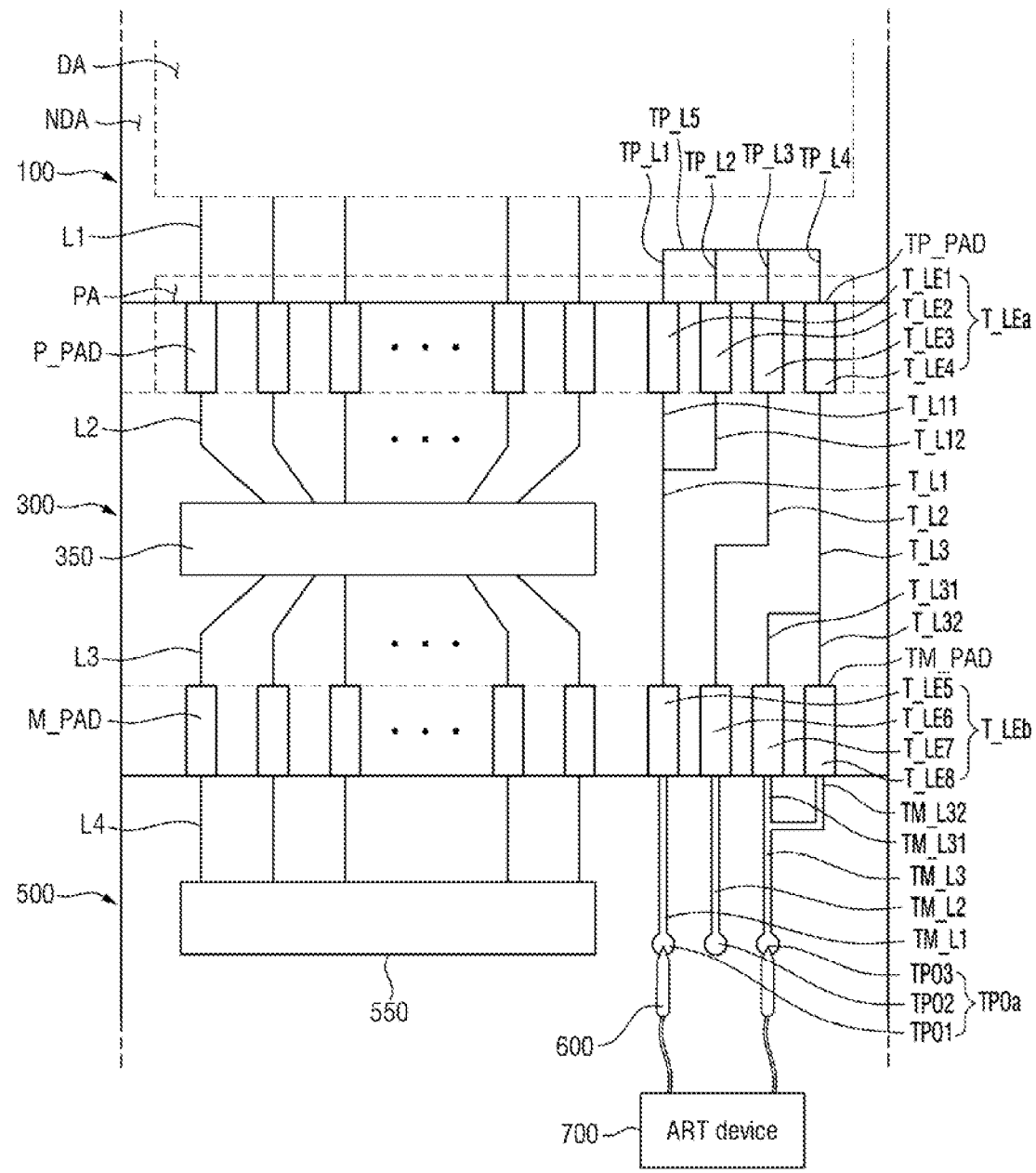
FIG. 12 is a planar layout view illustrating a case in which the third measured value is obtained.

FIG. 9 is a cross-sectional view illustrating a case in which a first measured value to a third measured value are obtained through the resistance measuring device, according to an exemplary embodiment of the present invention, FIG. 10 is a planar layout view illustrating a case in which the first measured value is obtained. FIG. 11 is a planar layout view illustrating a case in which the second measured value is obtained, and FIG. 12 is a planar layout view illustrating a case in which the third measured value is obtained.

First, referring to FIG. 10, the resistance measuring device 700 may input an input voltage to the first test point TPO1 through the jig 600, and measure an output voltage through the second test point TPO2. In other words, the input voltage input to the first test point TPO1 through the jig 600 may be measured as the output voltage by the resistance measuring device 700 through the jig 600 by passing through the first main test line TM_L1, the first main test pad TM_PAD1, the 2-1 test lead T_LE5, the first test lead line T_L1, the 1-1 test lead line T_L11 and the 1-2 test lead line T_L12 which are connected in parallel, the 1-1 test lead T_LE1 and the 1-2 test lead T_LE2 which are connected in parallel, the first panel test pad TP_PAD1 and the second panel test pad TP_PAD2 which are connected in parallel, the first panel test line TP_L1 and the second panel test line TP_L2, the panel common test line TP_L5, the third panel test line TP_L3, the third panel test pad TP_PAD3, the 1-3 test lead T_LE3, the second test lead line T_L2, the 2-2 test lead T_LE6, the second main test pad TM_PAD2, the second main test line TM_L2, and the second test point TPO2. For example, the input voltage may enter the first test point TPO1 travel along a first path from the first main test pad TM_PAD1 to the first panel test pad TP_PAD1 and the second panel test pad TP_PAD2 and then along a second path from the third panel test pad TP_PAD3 to the second main test pad TM_PAD2 to be measured as the output voltage at the second test point TPO2.

When a dropped voltage between the output voltage and the input voltage is divided by a predetermined current, a first measured value which is a resistance between the first test point TPO1 and the second test point TPO2 may be derived.

Referring to FIG. 9, the first measured value may be derived from the following equation.

$$\text{First measured value} = 2R_{JIG} + 2R_{TAB} + 2R_{cof} + 3/2R_{OLB} + R_{panel} \quad \text{[Equation 1]}$$

Here, $R_{JIG}$ may refer to a resistance of the jig 600. In other words, the first measured value may be a more precise measurement of the resistance between the first test point TPO1 and the second test point TPO2 by considering a resistance of the jig 600 itself.

Although the jig 600 that comes into contact with the first test point TPO1 and the jig 600 that comes into contact with the second test point TPO2 may have different resistances, the resistances of the two jigs 600 will be referred to as $R_{JIG}$ for convenience of description.

Although a contact resistance between the first main test pad TM_PAD1 and the 2-1 test lead T_LE5 and a contact resistance between the 2-2 test lead T_LE6 and the second main test pad TM_PAD2 may be different from each other according to constituting materials and properties of the coupling member configured to couple them, the two contact resistances will be referred to as $R_{TAB}$ for convenience of description.

Further, $R_{TAB}$ may refer to each of the contact resistance between the first main test pad TM_PAD1 and the 2-1 test lead T_LE5 and the contact resistance between the 2-2 test lead T_LE6 and the second main test pad TM_PAD2. Although the contact resistance between the first main test pad TM_PAD1 and the 2-1 test lead T_LE5 and the contact resistance between the 2-2 test lead T_LE6 and the second main test pad TM_PAD2 may be different front each other according to the constituting materials and the properties of the coupling member configured to couple them, the two contact resistances will be referred to as $R_{TAB}$ for convenience of description.

$R_{cof}$ may refer to a resistance of the first substrate 300. The resistance of the first substrate 300 may refer to each of the sum of a resistance of the printed base film 310 and resistances of the first test lead line T_L1, the 1-1 test lead line T_L11 and the 1-2 test lead line T_L12 which are connected in parallel, and the sum of the resistance of the printed base film 310 and the resistance of the second test lead line T_L2. Although the sum of the resistance of the printed base film 310 and the resistances of the first test lead line T_L1 the 1-1 test lead line T_L11 and the 1-2 test lead line T_L12 which are connected in parallel, and the sum of the resistance of the printed base film 310 and the resistance of the second test lead line T_L2 may be different, the two sums of the resistances will be referred to as $R_{cof}$ for convenience of description.

$R_{OLB}$ may refer to each of the sum of a contact resistance between the 1-1 test lead T_LE1 and the first panel test pad TP_PAD1 and a contact resistance between the 1-2 test lead T_LE2 and the second panel test pad TP_PAD2, and the sum of a contact resistance between the 1-3 test lead T_LE3 and the third panel test pad TP_PAD3.

As $R_{OLB}$, although the sum of the contact resistance between the 1-1 test lead T_LE1 and the first panel test pad TP_PAD1 and the contact resistance between the 1-2 test lead T_LE2 and the second panel test pad TP_PAD2, and the sum of the contact resistance between the 1-3 test lead T_LE3 and the third panel test pad TP_PAD3 may be different, the two sums of the resistances will be referred to as $R_{OLB}$ for convenience of description.

$R_{panel}$ may refer to the sum of a resistance of the display panel 100, and resistances of the first panel test line TP_L1, the second panel test line TP_L2, and the panel common test line TP_L5. Among these, the resistances of the first panel test line TP_L1, the second panel test line TP_L2, and the panel common test line TP_L5 may be respectively measured, but the resistance of the display panel 100 may not be accurately measured. Accordingly, as described above, when the factor of $R_{panel}$ is removed through a calculation between the first measured value to the third measured value, an accurate value of $R_{OLB}$ may be calculated.

Referring to FIG. 11, the resistance measuring device 700 may input an input voltage to the second test point TPO2 through the jig 600, and measure an output voltage through the third test point TPO3. In other words, the input voltage input to the second test point TPO2 through the jig 600 may be measured as the output voltage by the resistance measuring device 700 through the jig 600 by passing through the second main test line TM_L2, the second main test pad TM_PAD2, the 2-2 test lead T_LE6, the second test lead line T_L2, the 1-3 test lead T_LE3, the third panel test pad TP_PAD3, the third panel test line TP_L3, the panel common test line TP_L5, the fourth panel test line TP_L4, the fourth panel test pad TP_PAD4, the 1-4 test lead T_LE4, the third test lead line T_L3, the 3-1 test lead line T_L31 and the 3-2 test lead line T_L32 which are connected in parallel, the 2-3 test lead T_LE7 and the 2-4 test lead T_LE8 which are connected in parallel, the third main test pad TM_PAD3 and the fourth main test pad TM_PAD4 which are connected in parallel, the 3-1 main test line TM_L31 and the 3-2 main test line TM_L32 which are connected in parallel, and the third main test line TM_L3. For example, the input voltage may enter the second test point TPO2 travel along a first path from the second main test pad TM_PAD2 to the third panel test pad TP_PAD3 and then along a second path from the fourth panel test pad TP_PAD4 to the third main test pad TM_PAD3 and the fourth main test pad TM_PAD4 to be measured as the output voltage at the fourth test point TPO4.

When a dropped voltage between the output voltage and the input voltage is divided by a predetermined current, the second measured value which is a resistance between the second test point TPO2 and the third test point TPO3 may be derived.

Referring to FIG. 9, the second measured value may be derived from the following equation.

$$\text{Second measured value} = 2R_{JIG} + 3/2R_{TAB} + 2R_{cof} + 2R_{OLB} + R_{panel} \quad \text{[Equation 2]}$$

Referring to FIG. 12, the resistance measuring device 700 may input the input voltage to the first test point TPO1 through the jig 600, and measure the output voltage through the third test point TPO3. In other words, the input voltage input to the first test point TPO1 through the jig 600 may be measured as the output voltage by the resistance measuring device 700 through the jig 600 by passing through the first main test line TM_L1, the first main test pad TM_PAD1, the 2-1 test lead T_LE5, the first test lead line T_L1, the 1-1 test lead line T_L11 and the 1-2 test lead line T_L12 which are connected in parallel, the 1-1 test lead T_LE1 and the 1-2 test lead T_LE2 which are connected in parallel, the first panel test pad TP_PAD1 and the second panel test pad TP_PAD2 which are connected in parallel, the first panel test TP_L1 and the second panel test line TP_L2, the panel common test line TP_L5, the fourth panel test TP_L4, the fourth panel test pad TP_PAD4, the 1-4 test lead T_LE4, the third test lead line T_L3, the 3-1 test lead line T_L31 and the 3-2 test lead line T_L32 which are connected in parallel, the 2-3 test lead T_LE7 and the 2-4 test lead T_LE8 which are connected in parallel, the third main test pad TM_PAD3 and the fourth main test pad TM_PAD4 which are connected in parallel, the 3-1 main test line TM_L31 and the 3-2 main test line TM_L32 which are connected in parallel, the third main test line TM_L3, and the third test point TPO3. For example, the input voltage may enter the first test point TPO1 travel along a first path from the first main test pad TM_PAD1 to the first panel test pad TP_PAD1 and the second panel test pad TP_PAD2 and then along a second path from the fourth panel test pad TP_PAD4 to the third main test pad TM_PAD3 and the fourth main test pad TM_PAD4 to be measured as the output voltage at the third test point TPO32.

When a dropped voltage between the output voltage and the input voltage is divided by a predetermined current, a third measured value which is a resistance between the first test point TPO1 and the third test point TPO3 may be derived.

Retelling to FIG. 9, the third measured value may be derived from the following equation.

Third measured value=$2R_{JIG}+3/2R_{TAB}+2R_{cof}+3/2R_{OLB}+R_{panel}$ [Equation 3]

Further, $R_{OLB}$ may be derived from the following equation.

$R_{OLB}$=(second measured value−third measured value)×2 [Equation 4]

According to Equation 4, when the third measured value is subtracted from the second measured value, since the factor of $R_{panel}$ is removed, $R_{OLB}$ may be derived.

According to the above example, when the first measured value is derived, although only a case in which the input voltage is applied to the first test point TPO1 and the output voltage is measured from the second test point TPO2 is described, the present invention is not limited thereto, and the input voltage may be applied to the second test point TPO2 and the output voltage may be measured from the first test point TPO1.

Likewise, when the second measured value is derived, although only a case in which the input voltage is applied to the second test point TPO2 and the output voltage is measured from the third test point TPO3 is described, the present invention is not limited thereto, and the input voltage may be applied to the third test point TPO3 and the output voltage may be measured from the second test point TPO2.

Likewise, when the third measured value is derived, although only a case in which the input voltage is applied to the first test point TPO1 and the output voltage is measured from the third test point TPO3 is described, the present invention is not limited thereto, and the input voltage may be applied to the third test point TPO3 and the output voltage may be measured from the first test point TPO1.

As described above, a resistance of the display panel 100 itself among $R_{panel}$ may not be accurately measured. When the pixels of the display panel 100 are driven and thus the display panel 100 is degraded, the resistance of the display panel 100 itself may increase in proportion to the degradation. When the resistance of the display panel 100 itself increases, an inaccurate $R_{OLB}$ value may be calculated in the case in which the factor of $R_{panel}$ is included in $R_{OLB}$. A contact resistance between the panel pads PAD and the first lead lines LE1 is calculated with respect to the calculated $R_{OLB}$ value, and when an inaccurate $R_{OLB}$ value is calculated, the contact resistance between the panel pads PAD and the first lead lines LE1 becomes inaccurate. Accordingly, a data value, for example, a voltage value that should be applied from the driving integrated circuit 350 to the panel pads PAD and the first lead lines LE1, may be inaccurately determined, and when a voltage value with a large error compared to a normal reference value is applied, a pixel defect may be caused.

However, as shown in FIGS. 2 to 5, in the display device 1 according to the present embodiment, since a line including dummy electrodes of the display panel 100, the first substrate 300, and the second substrate 500 is designed, the factor of $R_{panel}$ is not included in $R_{OLB}$ and thus a precise $R_{OLB}$ value may be calculated.

Accordingly, it is possible to prevent a pixel defect that may be caused in determining a data value, for example, a voltage value that should be applied from the driving integrated circuit 350 to the panel pads PAD and the first lead lines LE1.

Figure 13:
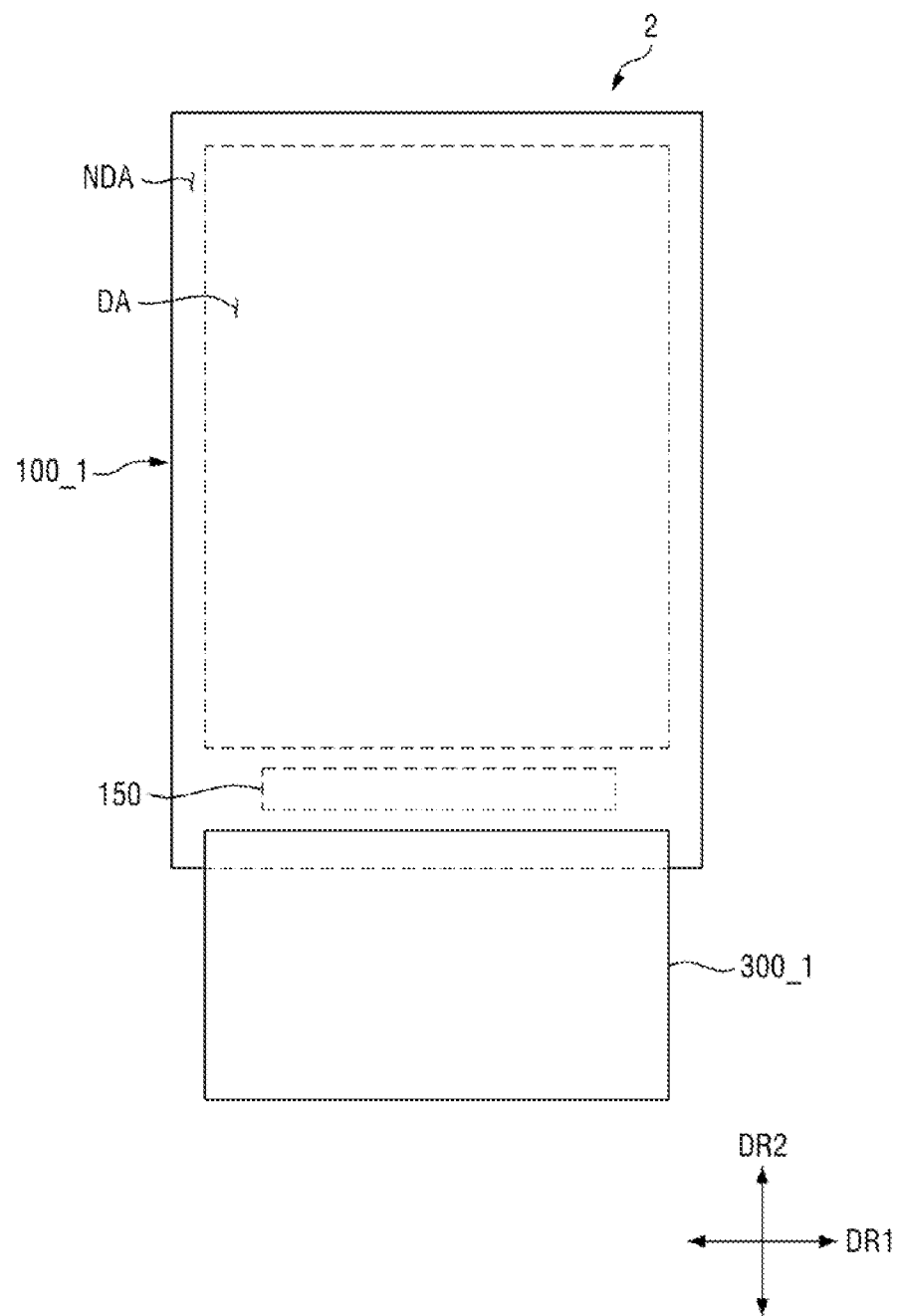
FIG. 13 is a planar layout view of a display device according to another exemplary embodiment of the present invention.
Figure 14:
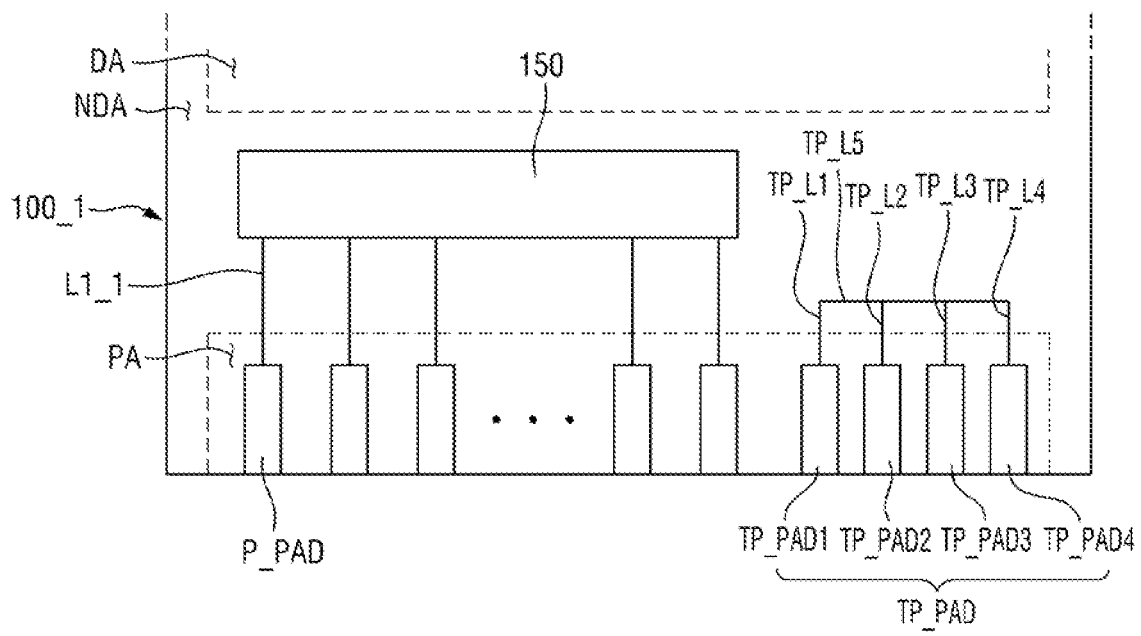
FIG. 14 is a planar layout view of a display panel in FIG. 13.
Figure 15:
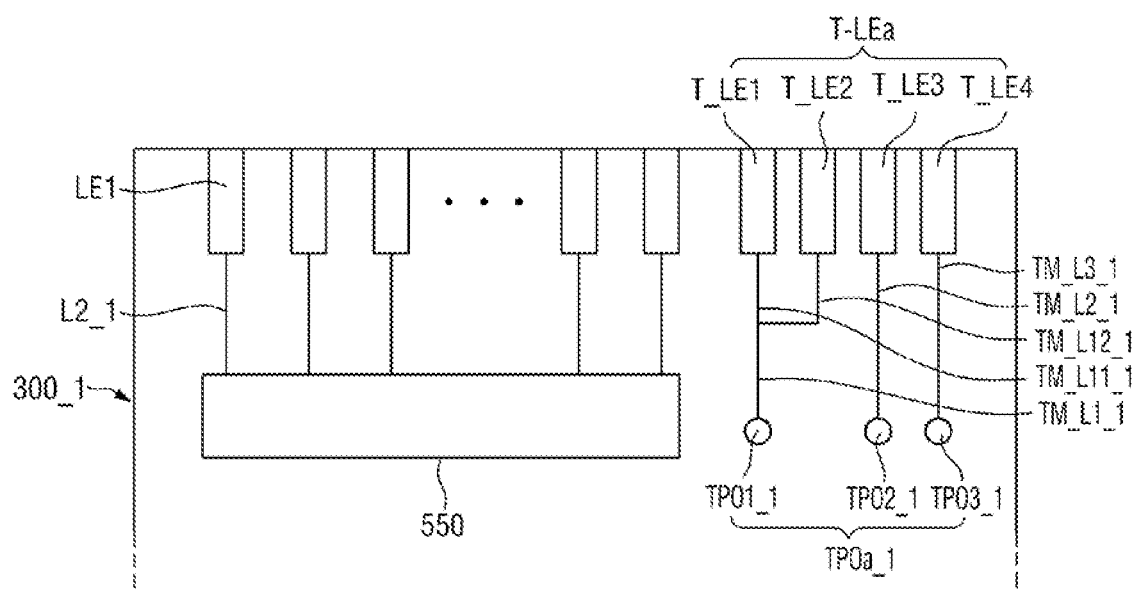
FIG. 15 is a planar layout view of a first substrate in FIG. 13.
Figure 16:
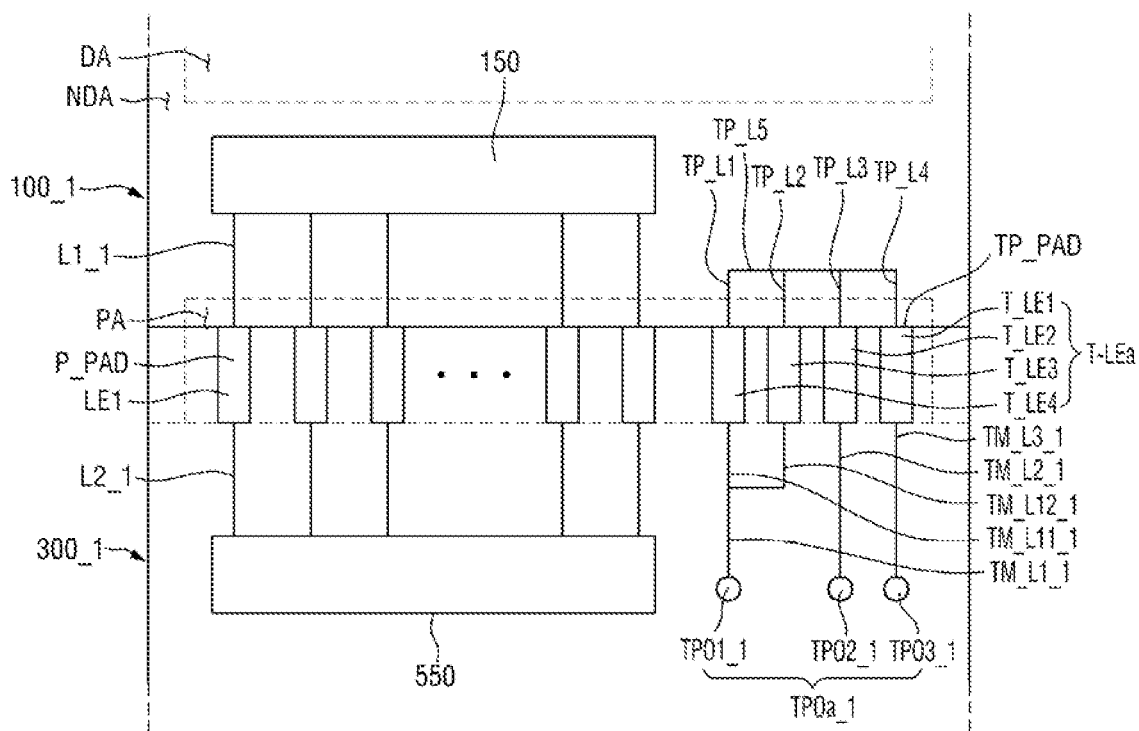
FIG. 16 is a planar layout view of the display panel and the first substrate in FIG. 13.
Figure 17:
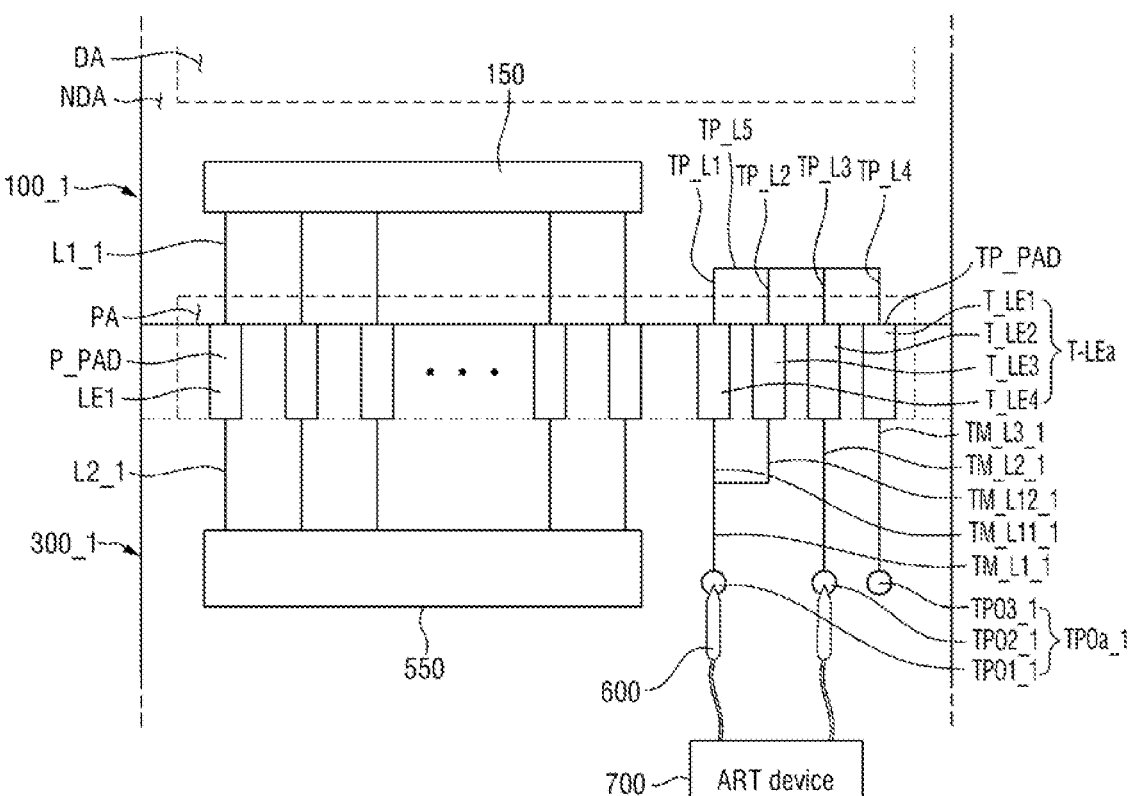
FIG. 17 is a planar layout view illustrating a case in which a first measured value is obtained, according to an exemplary embodiment of the present invention.
Figure 18:
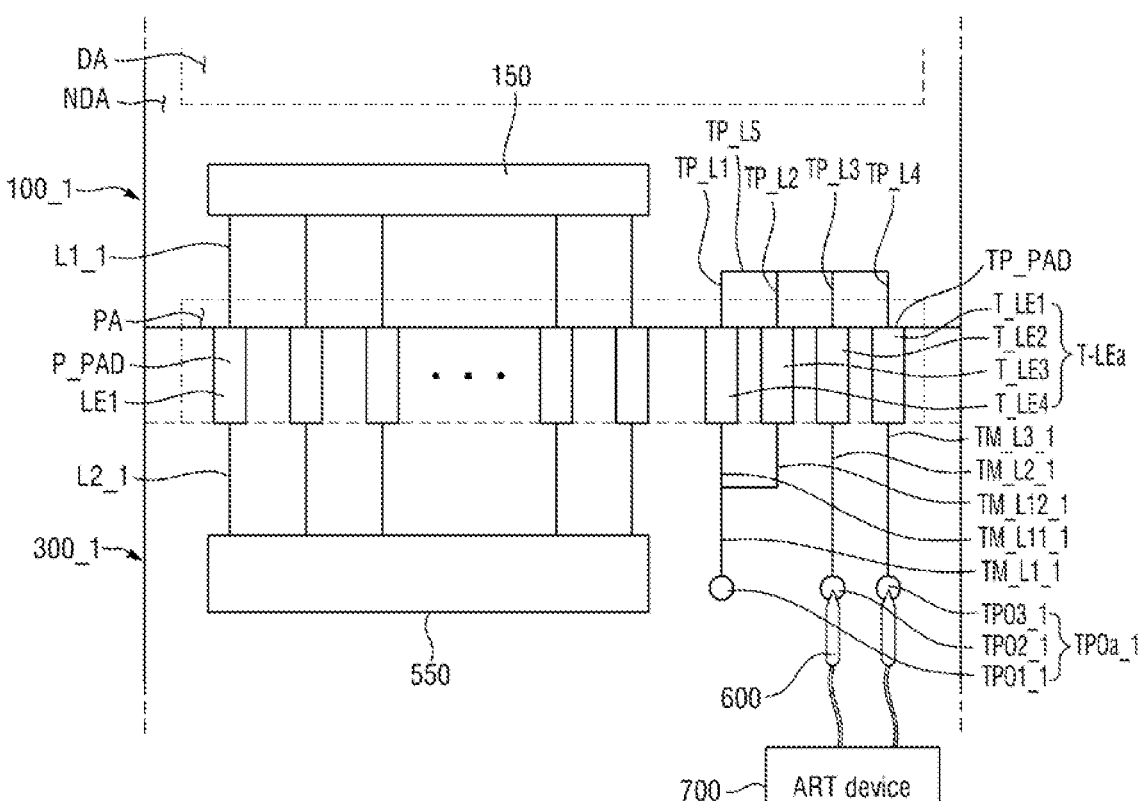
FIG. 18 is a planar layout view illustrating a case in which a second measured value is obtained, according to an exemplary embodiment of the present invention.

FIG. 13 is a planar layout view of a display device according to another exemplary embodiment of the present invention, FIG. 14 is a planar layout view of a display panel in FIG. 13, FIG. 15 is a planar layout view of a first substrate in FIG. 13, FIG. 16 is a planar layout view of the display panel and the first substrate in FIG. 13, FIG. 17 is a planar layout view illustrating a case in which a first measured value is obtained, according to an exemplary embodiment of the present invention, and FIG. 18 is a planar layout view illustrating a case in which a second measured value is obtained, according to an exemplary embodiment of the present invention.

Referring to FIGS. 13 to 18, a display device 2 according to the present embodiment is different from the display device 1 in that a driving integrated circuit 150 is disposed on a display panel 100_1.

For example, since the driving integrated circuit 150 is substantially the same as the driving integrated circuit 350 shown in FIG. 1 except that the disposition thereof is different, an overlapping description will be omitted.

A first substrate 300_1 may be attached to a pad area of the display parcel 100_1.

Referring to FIG. 14, panel pads P_PAD and the driving integrated circuit 150 may be connected to each other through first signal lines L1_1.

Since panel test pads TP_PAD1 to TP_PAD4 and panel test lines TP_L1 to TP_L5 have been described above with reference to FIG. 2, an overlapping description will be omitted.

Referring to FIG. 15, the first substrate 300_1 may include a main circuit part 550. Since the main circuit part 550 is substantially the same as the main circuit part 550 of the second substrate 500 in FIG. 1, an overlapping description will be omitted.

The main circuit part 550 and first lead lines LE1 may be electrically connected to each other through second signal lines L2_1.

A 1-1 test lead T_LE1 may be connected to a 1-1 main test line TM_L11_1, and a 1-2 test lead T_LE2 may be connected to a 1-2 main test line TM_L12_1. The 1-1 main test line TM_L11_1 and the 1-2 main test line TM_L12_1 may be connected to a first main test line TM_L1_1 in parallel.

A second main test line TM_L2_1 may be connected to a 1-3 test lead T_LE3, and a third main test line TM_L3_1 may be connected to a 1-4 test lead T_LE4.

The first main test line TM_L1_1 may be connected to a first test point TPO1_1, the second main test line TM_L2_1 may be connected to a second test point TPO2_1, and the third main test line T_LM3_1 may be connected to a third test point TPO3_1.

First, referring to FIG. 17, a resistance measuring device (see 700 in FIG. 17) may input an input voltage to the first test point TPO1_1 through the jig (see 600 in FIG. 17), and measure an output voltage through the second test point TPO2_1. In other words, the input voltage input to the first test point TPO1 through the jig 600 may be measured as the output voltage by the resistance measuring device 700 through the jig 600 by passing through the first main test line TM_L1_1, the 1-1 main test line TM_L11_1 and the 1-2 main test line TM_L12_1 which are connected in parallel, the 1-1 test lead T_LE1 and the 1-2 test lead T_LE2 which are connected in parallel, the first panel test pad TP_PAD1 and the second panel test pad TP_PAD2 which are connected in parallel, the first panel test line TP_L1 and the second panel test line TP_L2, the panel common test line TP_L5, the third panel test line TP_L3, the third panel test pad TP_PAD3, the 1-3 test lead T_LE3, the second main test line TM_L2_1, and the second test point TPO2_1.

When a dropped voltage between the output voltage and the input voltage is divided by a predetermined current, a fourth measured value which is a resistance between the first test point TPO1_1 and the second test point TPO2_1 may be derived.

Referring to FIG. 18, the resistance measuring device 700 may input the input voltage to the second test point TPO2_1 through the jig 600, and measure the output voltage through the third test point TPO3_1. In other words, the input voltage input to the second test point TPO2_1 through the jig 600 may be measured as the output voltage by the resistance measuring device 700 through the jig 600 by passing through the second main test line TM_L2_1, the 1-3 test lead T_LE3, the third panel test pad TP_PAD3, the third panel test line TP_L3, the panel common test line TP_L5, the fourth panel test line TP_L4, the fourth panel test pad TP_PAD4, the 1-4 test lead T_LE4, the third main test line TM_L3_1, and the third test point TPO3_1.

When a dropped voltage between the output voltage and the input voltage is divided by a predetermined current, a fifth measured value which is a resistance between the second test point TPO2_1 and the third test point TPO3_1 may be derived.

The fourth measured value may be derived from the following equation.

$$\text{Fourth measured value} = 2R_{JIG} + 2R_{cof} + 3/2R_{OLB}R_{panel} \quad \text{[Equation 5]}$$

The fifth measured value may be derived from the following equation.

$$\text{Fifth measured value} = 2R_{JIG} + 2R_{cof} + 2R_{OLB} + R_{panel} \quad \text{[Equation 6]}$$

Further, $R_{OLB}$ may be derived from the following equation.

$$R_{OLB} = (\text{fifth measured value} - \text{fourth measured value}) \times 2 \quad \text{[Equation 7]}$$

According to Equation 7, when the fourth measured value is subtracted from the fifth measured value, since the factor of $R_{panel}$ is removed, $R_{OLB}$ may be derived.

However, in the display device 2 according to the present embodiment, since a line including dummy electrodes of the display panel 100_1 and the first substrate 300_1 is designed as shown in FIGS. 14 to 16, the factor of $R_{panel}$ is not included in $R_{OLB}$ and thus a precise $R_{OLB}$ value may be calculated.

Accordingly, it is possible to prevent a pixel defect that may be caused in determining a data value, for example, a voltage value that should be applied from the first substrate 300_1 to the panel pads PAD and the first lead lines LE1.

Figure 19:
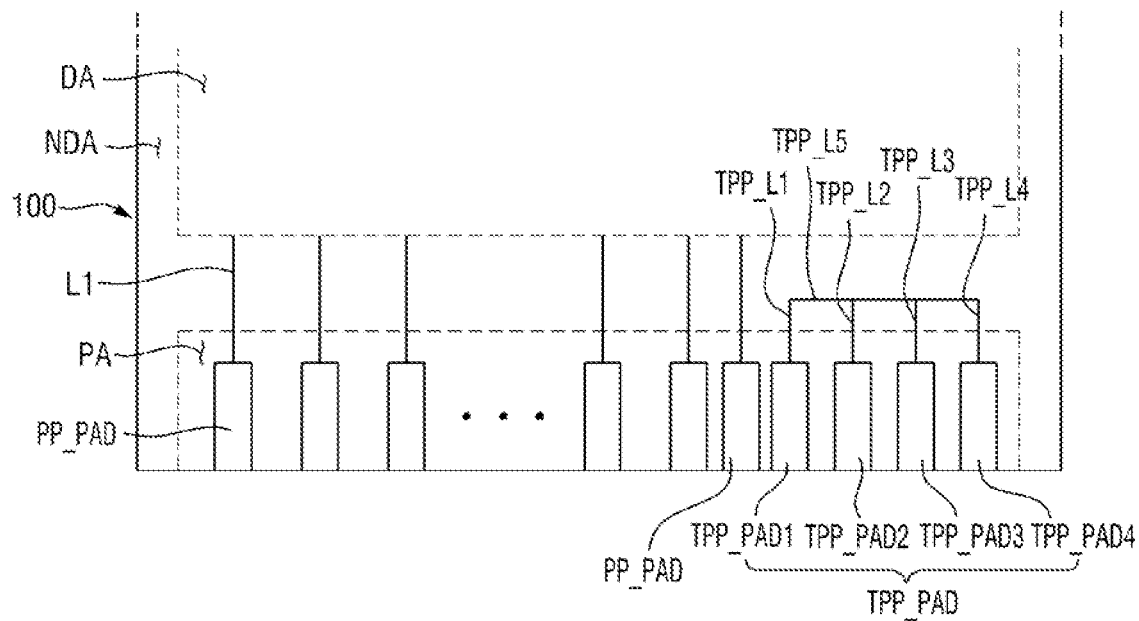
FIG. 19 is a planar layout view of a display panel according to still another exemplary embodiment of the present invention.
Figure 20:
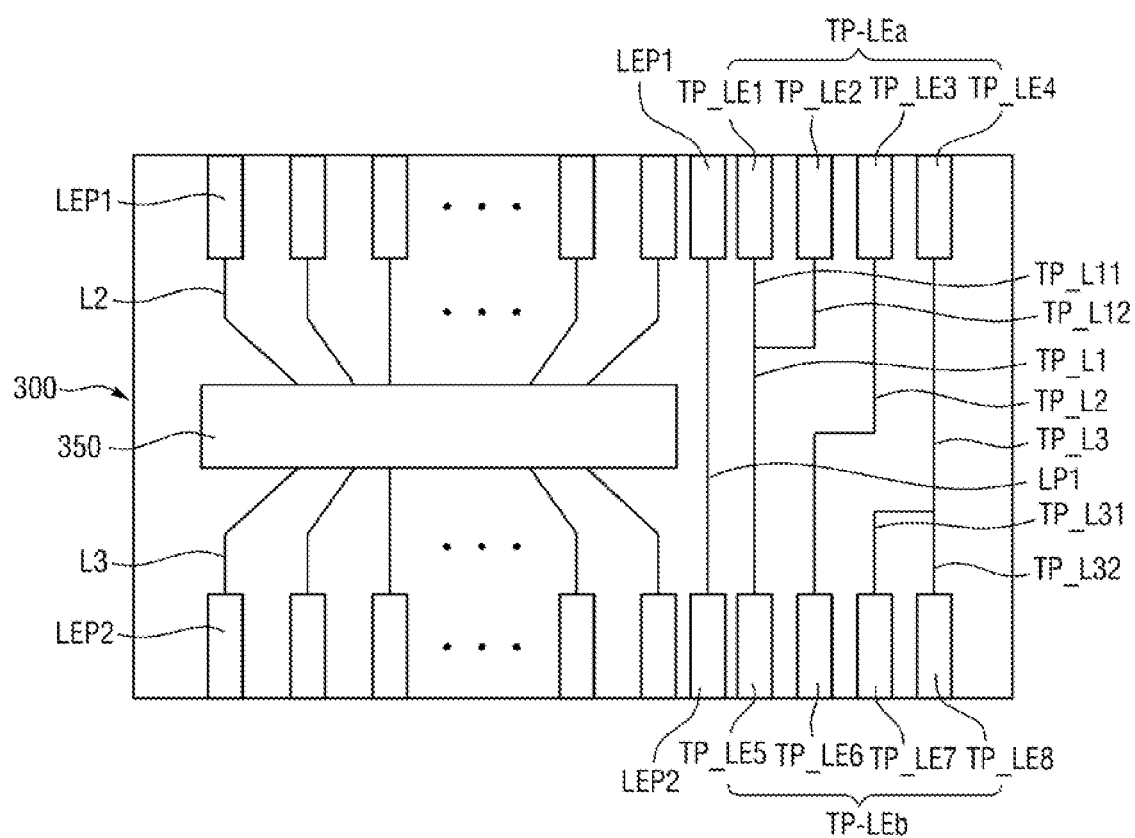
FIG. 20 is a planar layout view of a first substrate according to still another exemplary embodiment of the present invention.
Figure 21:
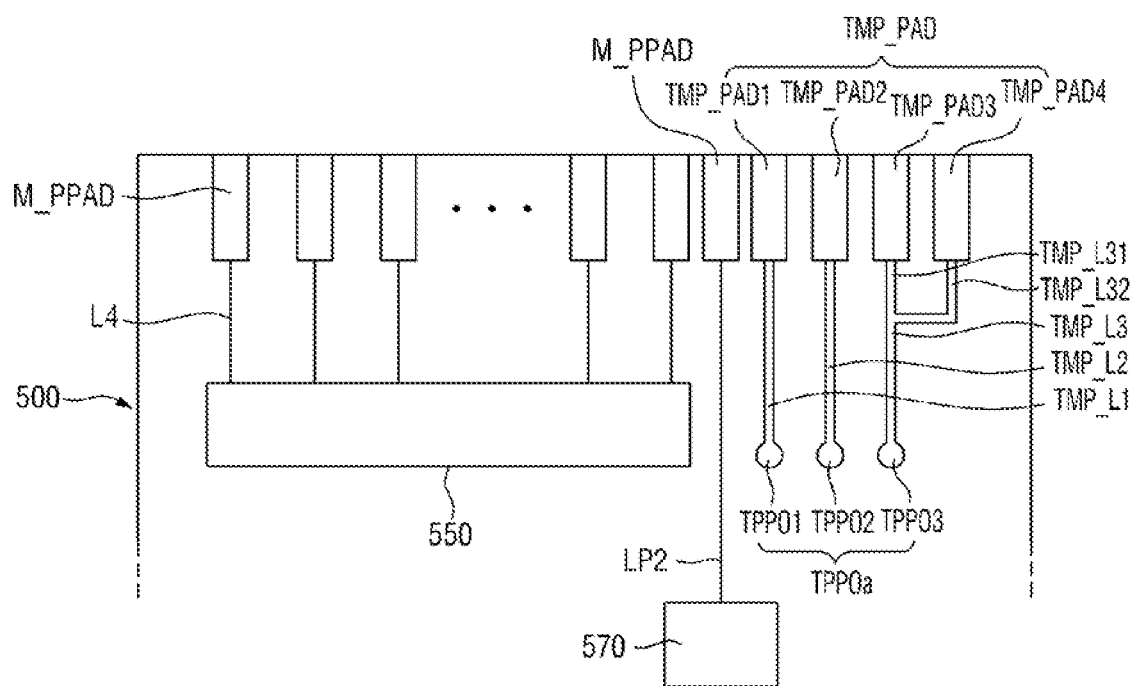
FIG. 21 is a planar layout view of a second substrate according to still another exemplary embodiment of the present invention.

FIG. 19 is a planar layout view of a display panel according to still another exemplary embodiment of the present invention, FIG. 20 is a planar layout view of a first substrate according to still another exemplary embodiment of the present invention, and FIG. 21 is a planar layout view of a second substrate according to still another exemplary embodiment of the present invention.

Referring to FIGS. 19 to 21, the display device according to the present embodiment is different from the display device according to the other embodiments in that power panel pads PP_PAD disposed in a panel pad area PA and connected to a display area DA through first signal lines L1 are further included, and the first substrate includes power lead lines LEP1 and LEP2 adjacent to a first lead line LE1 and a second lead line LE2, and a first power signal line LP1 configured to connect the power lead lines LEP1 and LEP2, and the second substrate further includes power main circuit pads M_PPAD adjacent to power main test pads TMP_PAD, a power driving part 570, and a second power signal line LP2 configured to electrically connect the power driving part 570 and the power main circuit pads M_PPAD.

For example, the display device according to the present embodiment may include power panel test pads TPP_PAD1 to TPP_PAD4 that perform the same functions as the panel test pads TP_PAD1 to TP_PAD4 of the display panel shown in FIGS. 2 to 4, power panel test lines TPP_L1 to TPP_L5 that perform the same functions as the panel test lines TP_L1 to TP_L5, may include power test leads TP_LEa and TP_LEb, and power test lead lines TP_L1 to TP_L3, TP_L11, TP_L12, TP_L31, and TP_L32 that respectively perform the same functions as the test leads T_LEa and T_LEb and the test lead lines T_L1 to T_L3, T_L11, T_L12, T_L31, and TL_32 of the above-described first substrate 300, and may include power main test pads TMP_PAD, power main test lines TMP_L1, TMP_L2, TMP_L3, TMP_L31, and TMP_L32, and power test points TPPOa that respectively perform the same functions as the main test pad TM_PAD, the main test lines TM_L1, TM_L2, TM_L3, TM_L31, and TM_L32, and the test points TPOa of the above-described second substrate 500.

Figure 22:
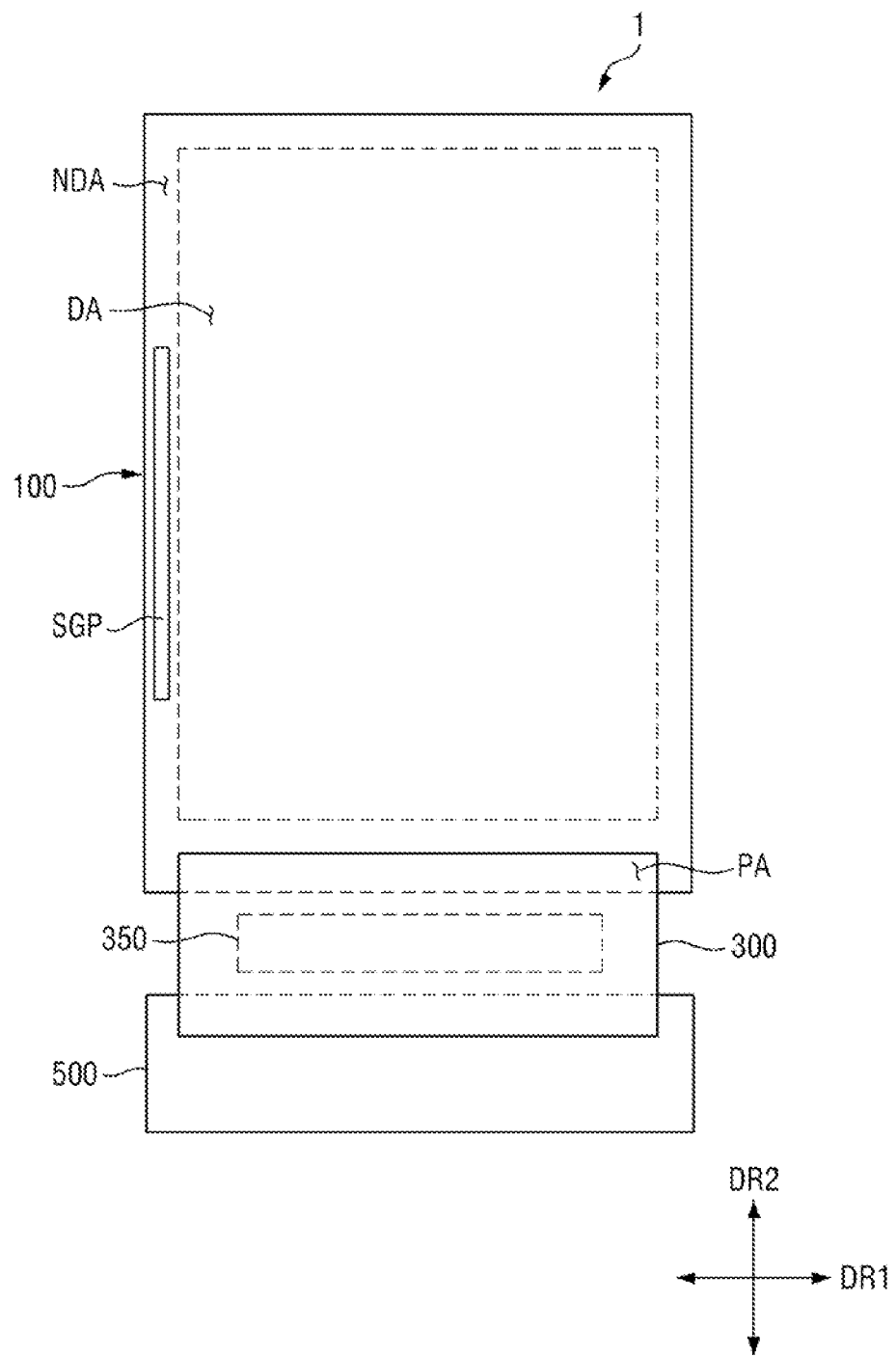
FIG. 22 is a planar layout view of a display device according to yet another exemplary embodiment of the present invention.
Figure 23:
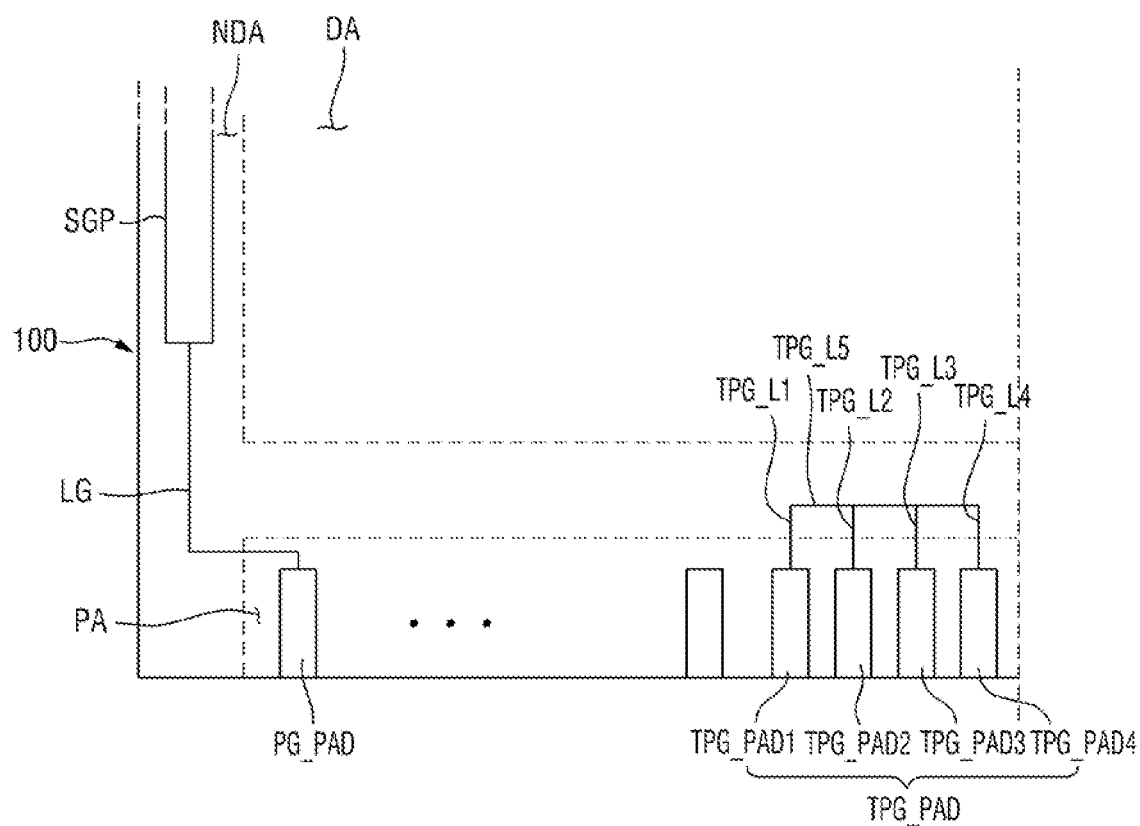
FIG. 23 is a planar layout view of a display panel in FIG. 22.
Figure 24:
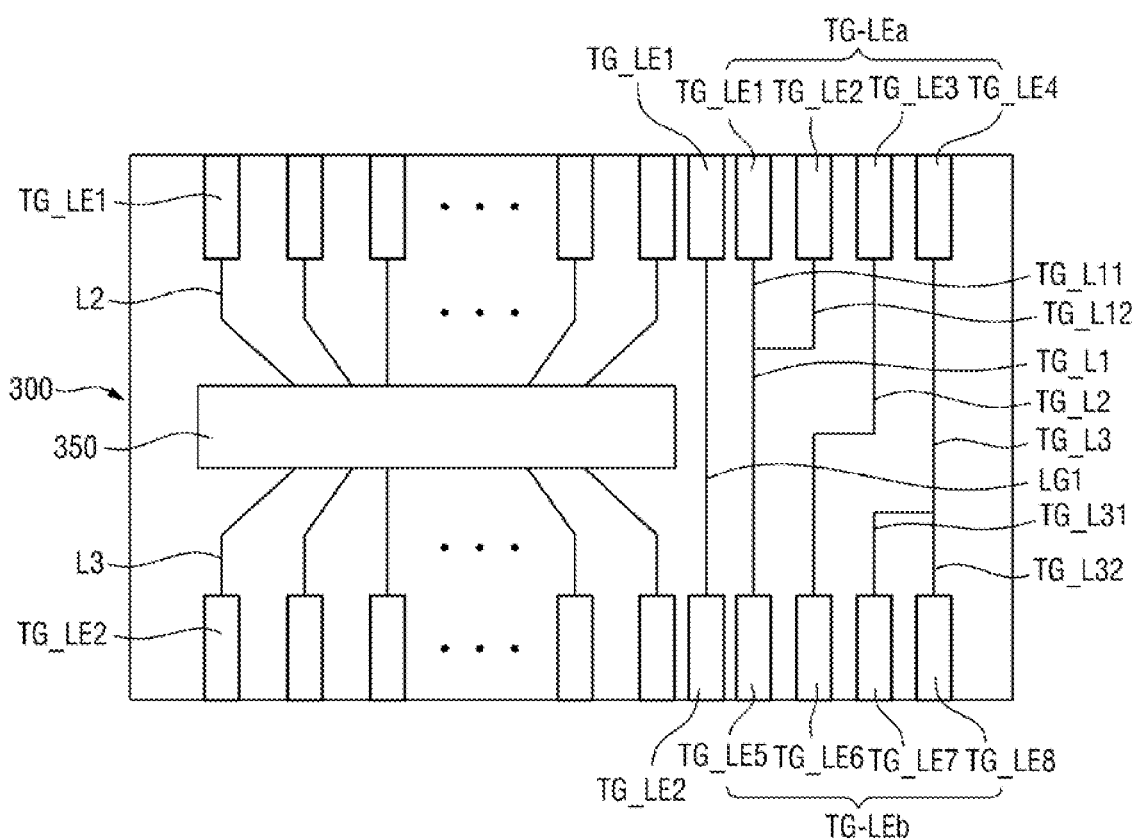
FIG. 24 is a planar layout view of a first substrate in FIGS. 22.
Figure 25:
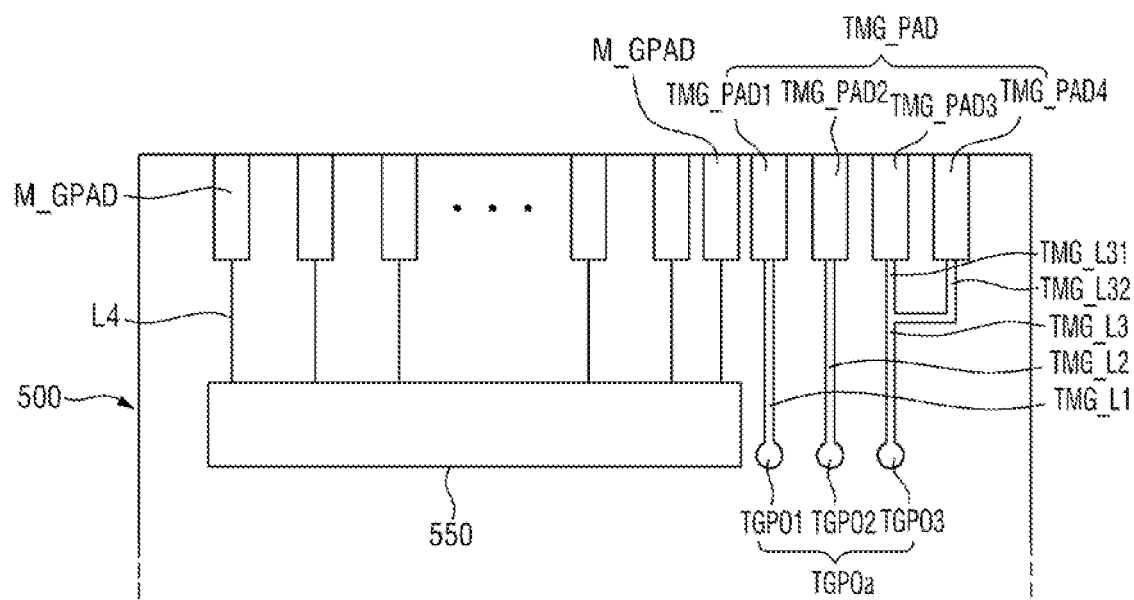
FIG. 25 is a planar layout view of a second substrate in FIG. 22.

FIG. 22 is a planar layout view of a display device according to yet another exemplary embodiment of the present invention, FIG. 23 is a planar layout view of a display panel in FIG. 22, FIG. 24 is a planar layout view of a first substrate in FIG. 22, and FIG. 25 is a planar layout view of a second substrate in FIG. 22.

Referring to FIGS. 22 to 25, the display device according to the embodiment is different from the display device according to the other embodiments in that a scan driving part SGP is further disposed in a non-display area NDA of a display panel 100, a first substrate includes scan lead lines TG_LE1 and TG_LE2 and a first scan signal line LG1 configured to connect the scan lead lines TG_LE1 and TG_LE2, and a second substrate further includes scan main circuit pads M_GPAD electrically connected to a main circuit part 550 through fourth signal lines L4.

In the display device according to the present embodiment, since a line including dummy electrodes of the display panel 100, a first substrate 300, and a second substrate 500 is designed, it is possible to prevent a pixel defect that may be caused in determining signals which should be applied from the second substrate 500 to a first scan lead line TG_LE1 and a scan panel pad PG_PAD and scan control signal values which control the scan signals For example, the display device according to the present embodiment may include scan panel test pads TPG_PAD1 to TPG_PAD4 that perform the same functions as the panel test pads TP_PAD1 to TP_PAD4 of the display panel shown in FIGS. 2 to 4, scan panel test lines TPG_L1 to TPG_L5 that perform the same functions as the panel test lines TP_L1 to TP_L5, may include scan test leads TG_LEa and TG_LEb and scan test lead lines TG_L1 to TG_L3, TG_L11, TG_L12, TG_L31, and TG_L32 that respectively perform the same functions as the test leads T_LEa and T_LEb and the test lead lines T_L1 to T_L3, T_L11, T_L12, T_L31, and T_L32 of the above-described first substrate 300, and may include scan main test pads TMG_PAD, scan main test lines TMG_L1, TMG_L2, TMG_L3, TMG_L31, and TMG_L32, and scan test points TPGOa that respectively perform the same functions as the main test pads TM_PAD the main test lines TM_L1, TM_L2, TM_L3, TM_L31, and TM_L32, and the test points TPOa of the above-described second substrate 500.

In the above described exemplary embodiments of the present invention, in a display device and an inspection method thereof, a contact resistance between pads and leads can be precisely measured.

Although exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
   a display panel;
   a first substrate attached to a side of the display panel; and
   a second substrate attached to a side of the first substrate,
   wherein the display panel includes a first panel test pad and a second panel test pad,
   the first substrate includes a 1-1 circuit test lead overlapping and connected to the first panel test pad, a 1-2 circuit test lead overlapping and connected to the second panel test pad, a 2-1 circuit test lead overlapping and connected to the second substrate, a 1-1 test lead line connected to the 1-1 circuit test lead, a 1-2 test lead line connected to the 1-2 circuit test lead, and a first test lead line connected to the 2-1 circuit test lead, and
   the 1-1 test lead line and the 1-2 test lead line are directly connected to each other at a first point and are directly connected to the first test lead line at the first point.

2. The display device of claim 1, wherein the second substrate includes a first main test pad overlapping and connected to the 2-1 circuit test lead, and a first test point connected to the first main test pad.

3. The display device of claim 2, wherein the first panel test pad and the second panel test pad are electrically connected to each other through a first panel test line connected to the first panel test pad, a second panel test line connected to the second panel test pad, and a panel common test line connecting the first panel test line and the second panel test line.

4. The display device of claim 3, wherein:
   the display panel further includes a third panel test pad and a third panel test line connected to the third panel test pad; and
   the third panel test line is connected to the panel common test line.

5. The display device of claim 4, wherein:
   the first substrate further includes a 1-3 circuit test lead overlapping and connected to the third panel test pad, and a 2-2 circuit test lead overlapping and connected to the second substrate; and
   the 1-3 circuit test lead is connected to the 2-2 circuit test lead.

6. The display device of claim 5, wherein the second substrate further includes a second main test pad overlapping and connected to the 2-2 circuit test lead, and a second test point connected to the second main test pad.

7. The display device of claim 6, wherein:
   the display panel further includes a fourth panel test pad and a fourth panel test line connected to the fourth panel test pad; and
   the fourth panel test line is connected to the panel common test line.

8. The display device of claim 7, wherein:
   the first substrate further includes a 1-4 circuit test lead overlapping and connected to the fourth panel test pad, and a 2-3 circuit test lead and a 2-4 circuit test lead overlapping and connected to the second substrate; and
   the 2-3 circuit test lead and the 2-4 circuit test lead are connected to the 1-4 circuit test lead.

9. The display device of claim 8, wherein:
   the second substrate further includes a third main test pad overlapping and connected to the 2-3 circuit test lead, and a fourth main test pad overlapping and connected to the 2-4 circuit test lead; and
   the third main test pad and the fourth main test pad are connected to a third test point.

10. The display device of claim 9, wherein:
    the first substrate further includes a first test lead line, a 1-1 test lead line, and a 1-2 test lead line;
    the first test lead line is physically connected to the 2-1 circuit test lead;
    the 1-1 test lead line is physically connected to the 1-1 circuit test lead;
    the 1-2 test lead line is physically connected to the 1-2 circuit test lead; and
    the 1-1 test lead line and the 1-2 test lead line are physically connected to the first test lead line.

11. The display device of claim 10, wherein the first substrate further includes a second test lead line configured to electrically connect the 1-3 circuit test lead and the 2-2 circuit test lead.

12. The display device of claim 11, wherein:
    the first substrate further includes a third test lead line connected to the 1-4 circuit test lead, a 3-1 lead test line connected to the 2-3 circuit test lead, and a 3-2 lead test line connected to the 2-4 circuit test lead; and
    the 3-1 lead test line and the 3-2 lead test line are connected to the third test lead line.

13. The display device of claim 9, wherein:
    the first substrate further includes a data driving integrated circuit; and
    all of the panel test pads, the circuit test leads, and the main test pads are insulated from the data driving integrated circuit.

14. The display device of claim 1, wherein:
the 1-1 test lead line is physically connected to the 1-1 circuit test lead;
the 1-2 test lead line is physically connected to the 1-2 circuit test lead;
the first test lead line is physically connected to the 2-1 circuit test lead; and
the 1-1 test lead line and the 1-2 test lead line are physically connected to the first test lead line.

15. A display device, comprising:
a display panel including a data driving integrated circuit; and
a first substrate attached to a side of the display panel,
wherein the display panel includes a first panel test pad and a second panel test pad,
the first substrate includes a 1-1 circuit test lead overlapping and connected to the first panel test pad, a 1-2 circuit test lead overlapping and connected to the second panel test pad, and a first test point directly connected to the 1-1 circuit test lead and the 1-2 circuit test lead.

16. The display device of claim 15, wherein:
the display panel further includes a third panel test pad; and
the first substrate further includes a 1-3 circuit test lead overlapping and connected to the third panel test pad, and a second test point connected to the 1-3 circuit test lead.

17. The display device of claim 15, wherein:
the display panel further includes a fourth panel test pad; and
the first substrate further includes a 1-4 circuit test lead overlapping and connected to the fourth panel test pad, and a third test point connected to the 1-4 circuit test lead.

18. The display device of claim 17, wherein:
the first substrate further includes a first test lead line, a 1-1 test lead line, and a 1-2 test lead line;
the first test lead line is connected to the first test point;
the 1-1 test lead line is physically connected to the 1-1 circuit test lead;
the 1-2 test lead line is physically connected to the 1-2 circuit test lead; and
the 1-1 test lead line and the 1-2 test lead line are physically connected to the first test lead line.

19. An inspection method of a display device, comprising:
providing a display device including a display panel including a first panel test pad, a second panel test pad, a third panel test pad and a fourth panel test pad, a first substrate including a 1-1 circuit test lead, a 1-2 circuit test lead, a 1-3 circuit test lead, a 1-4 circuit test lead, a 2-1 circuit test lead, a 2-2 circuit test lead, a 2-3 circuit teat lead and a 2-4 circuit test lead, wherein the 1-1 circuit test lead to the 1-4 circuit test lead are respectively connected to the first panel test pad to the fourth panel test pad, and a second substrate including a first main test pad, a second main test pad, a third main test pad and a fourth main test pad respectively connected to the 2-1 circuit test lead to the 2-4 circuit test lead, a first test point connected to the first main test pad, a second test point connected to the second main test pad, and a third test point connected to the third main test pad and the fourth main test pad, wherein the 1-1 circuit test lead and the 1-2 circuit test lead are connected to the 2-1 circuit test lead in parallel, the 1-3 circuit test lead is connected to the 2-2 circuit test lead, and the 2-3 circuit test lead and the 2-4 circuit test lead are electrically connected to the 1-4 circuit test lead;
bringing jigs into contact with the first test point and the second test point to obtain a first measured value;
bringing the jigs into contact with the second test point and the third test point to obtain a second measured value;
bringing the jigs into contact with the first test point and the third test point to obtain a third measured value; and
determining a contact resistance between the first panel test pad and the 1-1 circuit test lead, a contact resistance between the second panel test pad and the 1-2 circuit test lead, a contact resistance between the third panel test pad and the 1-3 circuit test lead and a contact resistance between the fourth panel test pad and the 1-4 circuit test lead using the first measured value, the second measure value and the third measured value.

20. The inspection method of claim 19, wherein:
in obtaining the first measured value, resistances of the jigs which come into contact with the first test point and the second test point are considered;
in obtaining the second measured value, resistances of the jigs which come into contact with the second test point and the third test point are considered; and
in obtaining the third measured value, resistances of the jigs which come into contact with the first test point and the third test point are considered.

21. The inspection method of claim 19, wherein a resistance value of the display panel is removed from the step of determining the contact resistance between the first panel test pad and the 1-1 circuit test lead, the contact resistance between the second panel test pad and the 1-2 circuit test lead, the contact resistance between the third panel test pad and the 1-3 circuit test lead and the contact resistance between the fourth panel test pad and the 1-4 circuit test lead.

* * * * *